United States Patent
Han et al.

(10) Patent No.: US 11,621,369 B2
(45) Date of Patent: Apr. 4, 2023

(54) SEMICONDUCTOR DEVICE

(71) Applicant: SUZHOU LEKIN SEMICONDUCTOR CO., LTD., Taicang (CN)

(72) Inventors: Dae Seob Han, Seoul (KR); Kwang Sun Baek, Seoul (KR); Young Suk Song, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 240 days.

(21) Appl. No.: 16/765,966

(22) PCT Filed: Dec. 26, 2018

(86) PCT No.: PCT/KR2018/016619
§ 371 (c)(1),
(2) Date: May 21, 2020

(87) PCT Pub. No.: WO2019/132490
PCT Pub. Date: Jul. 4, 2019

(65) Prior Publication Data
US 2021/0126162 A1     Apr. 29, 2021

(30) Foreign Application Priority Data

Dec. 27, 2017    (KR) .................. 10-2017-0181125

(51) Int. Cl.
*H01L 33/02*     (2010.01)
*H01L 33/24*     (2010.01)
*H01L 33/32*     (2010.01)

(52) U.S. Cl.
CPC ............ *H01L 33/025* (2013.01); *H01L 33/24* (2013.01); *H01L 33/32* (2013.01)

(58) Field of Classification Search
CPC ......... H01L 33/32; H01L 33/26; H01L 33/62; H01L 33/007; H01L 33/0075;
(Continued)

(56) References Cited

U.S. PATENT DOCUMENTS

2012/0138889 A1*   6/2012   Tachibana ............... H01L 33/32
                                                                         257/E33.048
2013/0069032 A1*   3/2013   Kushibe .................. H01L 33/06
                                                                         438/47

(Continued)

FOREIGN PATENT DOCUMENTS

JP       2014-096567       5/2014
JP       2016-181559      10/2016
(Continued)

OTHER PUBLICATIONS https://www.researchgate.net/publication/303380697_Efficiency_enhancement_of_InGaN_MQW_LED_using_compositionally_step_graded_InGaN_barrier_on_SiC_substrate (Year: 2016).*

(Continued)

*Primary Examiner* — Yu Chen
(74) *Attorney, Agent, or Firm* — Birch, Stewart, Kolasch & Birch, LLP

(57) ABSTRACT

A semiconductor device can define a plurality of points on the basis of an In ion concentration, a first dopant concentration, and a second dopant concentration, and identify each layer on the basis of a region between the points defined as above. The Mg concentration in a specific layer may increase along a specific direction and then decrease.

10 Claims, 9 Drawing Sheets

(58) Field of Classification Search
CPC ....... H01L 33/325; H01L 33/06; H01L 33/08; H01L 33/025; H01L 33/24
See application file for complete search history.

(56) References Cited

U.S. PATENT DOCUMENTS

| | | |
|---|---|---|
| 2013/0228742 A1* | 9/2013 | Tanaka ................... H01L 33/06 257/13 |
| 2014/0087508 A1* | 3/2014 | Miyazaki ............ H01L 33/0075 438/47 |
| 2014/0097456 A1 | 4/2014 | Kawashima |
| 2017/0186912 A1* | 6/2017 | Inoue .................. H01L 33/0075 |
| 2018/0062039 A1 | 3/2018 | Fujiwara |

FOREIGN PATENT DOCUMENTS

| | | |
|---|---|---|
| KR | 10-2012-0037099 | 4/2012 |
| KR | 10-2016-0050210 | 5/2016 |
| KR | 10-2016-0105177 | 9/2016 |
| KR | 10-2017-0000215 | 1/2017 |

OTHER PUBLICATIONS

International Search Report dated Apr. 8, 2019 issued in Application No. PCT/KR2018/016619.

* cited by examiner

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2018/016619, filed Dec. 26, 2018, which claims priority to Korean Patent Application No. 10-2017-0181125, filed Dec. 27, 2017, whose entire disclosures are hereby incorporated by reference.

TECHNICAL FIELD

An embodiment relates to a semiconductor device.

BACKGROUND ART

A semiconductor device containing a compound such as GaN, AlGaN, etc. may have many advantages such as a wide and easily adjustable band gap energy and thus may be used as a light-emitting device, a light-receiving device, and various diodes.

In particular, a light-emitting device such as a light-emitting diode, or a laser diode using a group III-V compound semiconductor or a group II-VI compound semiconductor may render various colors such as red, green, blue, and ultraviolet light due to development of a thin-film growth technology and new device materials. The light-emitting device may realize an efficient white light beam using a fluorescent material or by combining colors. The light-emitting device may have advantages of low power consumption, semi-permanent lifespan, fast response speed, safety, and environment friendliness, compared to conventional light-sources such as fluorescent and incandescent lamps.

For example, a nitride semiconductor for the light-emitting device has a high thermal stability and a wide bandgap energy, and thus is in the spotlight for developing an optical device and a high-power electronic device. In particular, a blue light-emitting device, a green light-emitting device, an ultraviolet (UV) light-emitting device, and a red light-emitting device using the nitride semiconductor are commercially available and widely used.

Recently, as a demand for a high-efficiency LED has increased, luminous intensity improvement has been a challenge. However, satisfactory improvement in the luminous intensity has not yet been achieved.

SUMMARY

An embodiment provides a semiconductor device and a semiconductor device package in which luminous intensity may be increased.

An embodiment provides a semiconductor device that does not require an additional component to increase the luminous intensity, and a semiconductor device package including the same.

An embodiment provides a semiconductor device in which a recess such as a V-pit contributing to increase in the luminous intensity may be identified based on change in a concentration of a dopant included therein, and a semiconductor device package including the same.

A semiconductor device in accordance with an embodiment includes a first conductive-type semiconductor layer; a second conductive-type semiconductor layer on the first conductive-type semiconductor layer; and an active layer disposed between the first conductive-type semiconductor layer and the second conductive-type semiconductor layer.

When primary ions are irradiated to the first conductive-type semiconductor layer, the active layer, and the second conductive-type semiconductor layer, secondary ions are emitted from the first conductive-type semiconductor layer, the active layer, and the second conductive-type semiconductor layer. An indium (In) ion intensity, a silicon (Si) concentration, and a carbon (C) concentration of the first conductive-type semiconductor layer, the active layer, and the second conductive-type semiconductor layer are detected based on the emitted secondary ions.

The semiconductor device has a plurality of inflection points of the indium (In) ion intensity, wherein the indium (In) ion intensities at the plurality of inflection points are 0.3 to 0.5 times of a highest indium (In) ion intensity in a vertical entire region of the semiconductor device, wherein the semiconductor device has: a first point having the same indium (In) ion intensity as a lowest indium (In) ion intensity among the indium (In) ion intensities at the plurality of inflection points, wherein the first point is adjacent to a location having a lowest indium (In) ion intensity in a direction toward a first vertical end of the semiconductor device; a second point having the same indium (In) ion intensity as a lowest indium (In) ion intensity among the indium (In) ion intensities at the plurality of inflection points, wherein the second point is closest to a location having a lowest indium (In) ion intensity in a direction toward a second vertical end of the semiconductor device, wherein the first and second vertical ends are opposite to each other; a third point present in a partial region where the Si concentration is 0.1 to 0.2 times of a highest Si concentration in the vertical entire region of the semiconductor device, wherein the third point has a highest Si concentration in the partial region, wherein the third point is adjacent to a location having a highest Si concentration in a direction toward the second vertical end of the semiconductor device; a first inflection point of the Mg concentration located at the same point as the first point; a second inflection point adjacent to the first inflection point in a direction toward the first vertical end of the semiconductor device, wherein the second inflection point has the Mg concentration higher than the Mg concentration of the first inflection point; and a third inflection point adjacent to the second inflection point in a direction toward the first vertical end of the semiconductor device, wherein the third inflection point has the Mg concentration higher than the Mg concentration of the first inflection point, and lower than the Mg concentration of the second inflection point.

The active layer corresponds to a region between the first point and the second point, wherein the first conductive-type semiconductor layer corresponds to a region between the second point and the third point.

The second conductive-type semiconductor layer includes a first second-conductive-type semiconductor layer and a second second-conductive-type semiconductor layer, wherein the first second-conductive-type semiconductor layer corresponds to a region between the first point and the second inflection point, and the second second-conductive-type semiconductor layer corresponds to a region between the second inflection point and the third inflection point.

The Mg concentration in the first second-conductive-type semiconductor layer increases in a direction toward the first vertical end of the semiconductor device, wherein the Mg concentration in the second second-conductive-type semiconductor layer decreases in a direction toward the first vertical end of the semiconductor device.

Advantageous Effects

According to the embodiment, each layer of the semiconductor device may be easily identified based on the concentration of the second dopant and/or the indium (In) ion intensity as obtained from the SIMS data.

According to the embodiment, the shape of the recess may be easily identified by tracking the concentration of the second dopant based on the concentration of the second dopant and/or the indium (In) ion intensity as obtained from the SIMS data.

According to the embodiment, the process may be easily controlled to obtain a desired recess shape or an optimal recess shape by tracking the concentration of the second dopant based on the concentration of the second dopant and/or the indium (In) ion intensity as obtained from SIMS data.

According to the embodiment, by adjusting at least one of the temperature, the thickness, and the indium (In) content may allow a recess such as a V-pit extending to the active layer and the p-type semiconductor layer to be formed. Further, a size of the recess and an arrangement density of the recesses may be precisely adjusted such that light from the active layer may be easily extracted through an inclined face of the recess, and a hole of the p-type semiconductor layer may be easily injected into the active layer through the recess, resulting in improved light efficiency. The luminous intensity may be increased due to the improvement of light extraction efficiency, and light efficiency.

According to the embodiment, the shape of the recess formed in the active layer may be easily identified based on the change in the magnesium concentration using an ion analysis device.

According to the embodiment, a process of identifying the change in the magnesium concentration in the active layer using the ion analysis device may continue. Thus, based on the identification result, the recess shape may be controlled so that a point at which the magnesium concentration is at the lowest, that is, a last point where the magnesium concentration is zero is present in the active layer. Thus, the light extraction from the active layer may be maximized while maximizing the deep-hole injection effect, thereby improving the light efficiency and improving the light output and the operation voltage.

DETAILED DESCRIPTIONS

Figure 1:
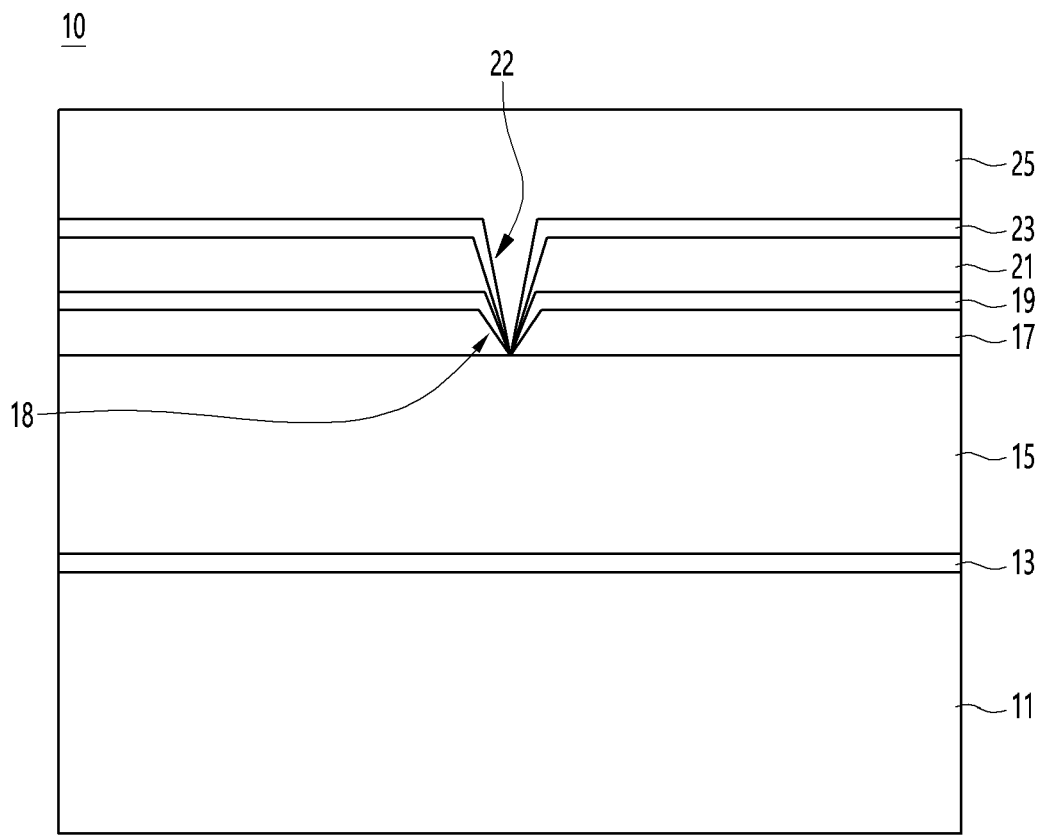
FIG. 1 shows a semiconductor device according to a first embodiment.

Hereinafter, preferred embodiments of the present disclosure will be described in detail with reference to the accompanying drawings. However, the technical idea of the present disclosure is not limited to some embodiments as described, but may be implemented in various different forms. At least one of components in one embodiment may be selectively combined with or substituted with at least one of components in another embodiment, within the technical idea range of the present disclosure. Further, the terms used in the embodiment of the present disclosure (including technical and scientific terms) have meanings that may be generally understood by those of ordinary skill in the technical field to which the present disclosure belongs, unless explicitly defined and described. Commonly used terms such as terms defined in dictionaries may be interpreted with considering contextual meaning thereof in the related art. Further, the term used in the embodiment of the present disclosure is intended for describing embodiments and is not intended to limit the present disclosure. As used herein, the singular forms "a" and "an" are intended to include the plural forms as well, unless the context clearly indicates otherwise. As used herein, the term "and/or" includes any and all combinations of at least one of the associated listed items. Expression such as "at least one of" when preceding a list of elements may modify the entire list of elements and may not modify the individual elements of the list. It will be understood that, although the terms "first", "second", "third" and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. It will be understood that when an element or layer is referred to as being "connected to", or "coupled to" another element or layer, it may be directly on, connected to, or coupled to the other element or layer, or at least one intervening elements or layers may be present. In addition, it will also be understood that when an element or layer is referred to as being "between" two elements or layers, it may be the only element or layer between the two elements or layers, or at least one intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

Hereinafter, an embodiment for solving the above problems will be described with reference to the accompanying drawings.

Further, as used herein, when an element is disposed "on" or "on a top" of another element, the former may directly contact the latter or still another element may be disposed between the former and the latter. As used herein, when an element is directly disposed "on" or "on a top" of another element, the former directly contacts the latter and still another element is not disposed between the former and the latter. Further, as used herein, when an element is disposed "below" or "under" another element, the former may directly contact the latter or still another element may be disposed between the former and the latter. As used herein, when an element is directly disposed "below" or "under" another element, the former directly contacts the latter and still another element is not disposed between the former and the latter.

The semiconductor device may include various electronic devices including light-emitting devices and light-receiving devices. Each of the light-emitting device and the light-receiving device may include a semiconductor structure including at least a first semiconductor layer, an active layer, and a second semiconductor layer. The semiconductor device according to an embodiment may be a light-emitting device. The light-emitting device may emit light via recombination between first carriers, that is, electrons and second carriers, that is, holes. A wavelength of the light may be determined based on a bandgap energy inherent to a material. Therefore, the emitted light may vary depending on a composition of the material.

The light-emitting device may be referred to as a semiconductor light-emitting device.

In a following description, a first dopant may be silicon (Si), and a second dopant may be magnesium (Mg). However, the present disclosure is not limited thereto.

Figure 7:
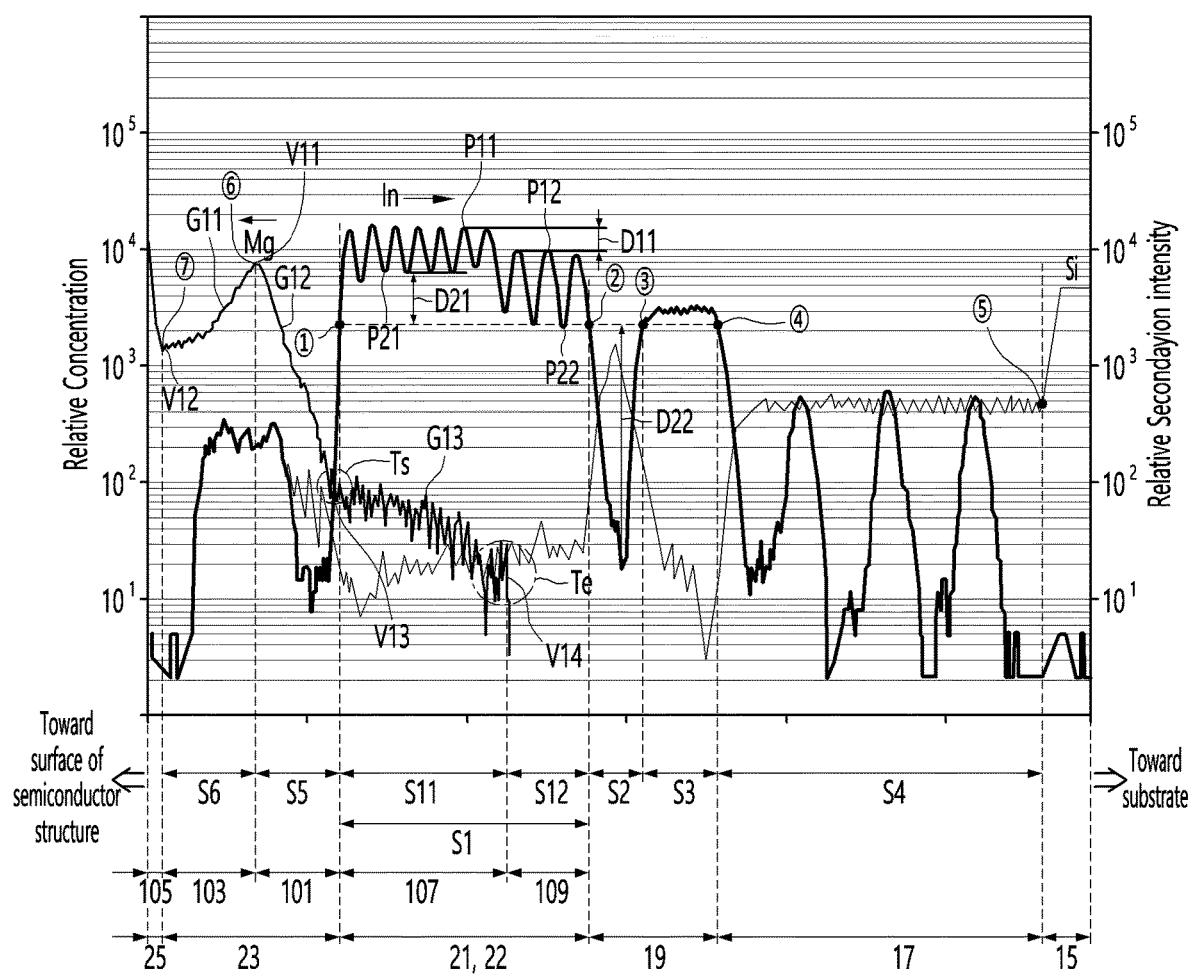
FIG. 7 shows a second carrier profile when each layer has a recess.

As will be explained below, as illustrated in FIG. 7, a fifth semiconductor layer 23 may include a first layer 101 and a second layer 103. The second semiconductor layer 25 may include a third layer 105. An active layer 21 may have a first recess 22. The active layer 21 may include a fourth layer 107 and a fifth layer 109 formed in the first recess 22. For example, the fourth layer 107 may contact the first layer 101. In another example, the fourth layer 107 and fifth layer 109 may be included in a conductive-type semiconductor layer including a second dopant, such as the second semiconductor layer 25 or the fourth semiconductor layer 23.

For example, the first to fifth layers 101, 103, 105, 107 and 109 may include a dopant made of magnesium. Each of the first to fifth layers 101, 103, 105, 107 and 109 may be defined based on a change in a doping concentration of the magnesium. However, the present disclosure is not limited thereto. For example, the concentration of the dopant in the first layer 101 may increase in a first direction, the concentration of the dopant in the second layer 103 may decrease in the first direction, and the concentration of the dopant in the third layer 105 may increase in the first direction.

Each of the second semiconductor layer 25 and the fourth semiconductor layer 23 may be referred to as a second conductive-type semiconductor layer. The second conductive-type semiconductor layer may further include at least one semiconductor layer other than the second semiconductor layer 25 and the fourth semiconductor layer 23. However, the present disclosure is not limited thereto. In addition, each of the first semiconductor layer 15, the third semiconductor layer 17 and the fourth semiconductor layer 19 may be referred to as a first conductive-type semiconductor layer.

The first direction as defined above may refer to a direction from the first conductive-type semiconductor layer to the second conductive-type semiconductor layer.

For example, gradients of the concentration of the dopant in the first to fifth layers 101, 103, 105, 107 and 109, respectively may be different from each other.

The dopant made of the magnesium may not be contained in a remaining region of the active layer 21 except the fourth layer 107 and the fifth layer 109 disposed in the first recess 22. However, the present disclosure is not limited thereto.

For example, the concentration of the dopant in the fourth layer 107 may be lower than that of the second layer 103. For example, the highest concentration of the dopant in the second layer 103 may be 10 to 1000 times larger than the highest concentration of the dopant in the fourth layer 107. For example, the concentration of the dopant in the fourth layer 107 may be lower by at least 10 times than the concentration of the dopant in the second layer 103.

For example, the concentration of the dopant in the fifth layer 109 may be zero. That is, magnesium may not be present in the fifth layer 109 of the first recess 22.

For example, the concentration of the dopant in the fourth layer 107 may decrease in a second direction, which is a direction opposite to the first direction.

For example, the concentration gradient of the dopant of the first layer 101 and the concentration gradient of the dopant of the fourth layer 107 may be different from each other.

For example, the concentration gradient of the dopant of the fourth layer 107 may be lower than the concentration gradient of the dopant of the first layer 101.

For example, a minimum concentration of the dopant in the first layer 101 may be equal to a maximum concentration of the dopant in the fourth layer 107.

For example, a size of the first recess 22 may be increased in the first direction. For example, when a depth of the first recess 22 is constant, the concentration gradient of the dopant along the second direction may vary based on a size of a topmost region of the first recess 22. For example, when a size of the topmost region of the first recess 22 is constant, the concentration gradient of the dopant along the second direction may vary based on the depth of the first recess 22.

For example, the concentration of the dopant in the topmost region of the first recess 22 may be lower than the lowest concentration of the dopant in the second layer 103.

For example, the depth of the first recess 22 may be smaller than the thickness of the active layer 21.

For example, the first conductive-type semiconductor layer may include a second recess 18, and the second recess 18 may overlap with the first recess 22 in the first direction.

Structure of Semiconductor Device

FIG. 1 shows a semiconductor device according to a first embodiment.

Referring to FIG. 1, a semiconductor device 10 according to the first embodiment may include the first semiconductor layer 15, the active layer 21 disposed on the first semiconductor layer 15 and the second semiconductor layer 25 disposed on the active layer 21. The semiconductor device 10 according to the first embodiment may further include the third semiconductor layer 17 and the fourth semiconductor layer 19 disposed between the first semiconductor layer 15 and the active layer 21, and the fifth semiconductor layer 23 disposed between and the active layer 21 and the second semiconductor layer 25.

The fifth semiconductor layer 23 may include the first layer 101 and the second layer 103. The second semiconductor layer 25 may include the third layer 105. The active layer 21 may have the first recess 22. The active layer 21 may include the fourth layer 107 and the fifth layer 109 formed in the first recess 22. For example, the fourth layer 107 may contact the first layer 101.

The first recess 22 may pass through the active layer 21, the fourth semiconductor layer 19 and the third semiconductor layer 17 and terminate at a bottom of the third semiconductor layer 17 or at a point above the bottom. That is, a size of the recess 22 may be zero at the bottom of the third semiconductor layer 17 or at the point above the bottom.

The first semiconductor layer 15, the third semiconductor layer 17 and the fourth semiconductor layer 19 may be referred to as the first conductive-type semiconductor layer. The second semiconductor layer 25 and the fourth semiconductor layer 23 may be referred to as the second conductive-type semiconductor layer.

The first semiconductor layer 15, the active layer 21 and the second semiconductor layer 25 may constitute a semiconductor structure. The semiconductor structure may be referred to as a light emission structure. When an electrical signal is supplied to the semiconductor structure, light corresponding to the electrical signal may be generated and may be emitted from the semiconductor structure. The intensity of the light may be proportional to the intensity of the electrical signal.

The first semiconductor layer 15 may be, for example, an n-type semiconductor layer, and the second semiconductor layer 25 may be a p-type semiconductor layer. However, the present disclosure is not limited thereto. The n-type semiconductor layer may contain a first carrier as a majority carrier, for example, an electron. The p-type semiconductor layer may contain a second carrier as a majority carrier, for example, a hole.

When an electrical signal is supplied to the semiconductor structure, the first carrier of the first semiconductor layer 15, and the second carrier of the second semiconductor layer 25 may be injected into the active layer 21. In the active layer 21, the second carrier and the first carrier are recombined with each other to emit light of a wavelength region corresponding to a bandgap energy of the active layer 21. The bandgap energy may be determined based on the compound semiconductor material. For example, ultraviolet light or infrared light may be emitted depending on the compound semiconductor material of the active layer 21.

In order to improve electrical and optical properties, at least one layer may be disposed under the semiconductor structure, above the semiconductor structure, and/or within the semiconductor structure.

For example, a buffer layer 13 may be disposed under the first semiconductor layer 15. For example, the third semiconductor layer 17, and the fourth semiconductor layer 19 may be disposed between the first semiconductor layer 15 and the active layer 21. For example, the fifth semiconductor layer 23 may be disposed between the active layer 21 and the second semiconductor layer 25.

The third semiconductor layer 17 may be a middle temperature (MT) layer. In this connection, the middle temperature may be a temperature for forming the third semiconductor layer 17. A growth temperature of the third semiconductor layer 17 may be lower than a growth temperature of the first semiconductor layer 15.

In growth of the third semiconductor layer 17, vertical and horizontal growth rates may be controlled by adjusting a temperature, adjusting an indium (In) content, and adjusting a thickness of each sub-semiconductor layer (see 17a, and 17b in FIG. 2), such that recesses 18 may be formed. For example, the recess 18 may have a V-pit shape.

A recess may be formed in each of the fourth semiconductor layer 19, the active layer 21 and the fifth semiconductor layer 23 in a corresponding manner to the recesses 18 formed in the third semiconductor layer 17. Each of the recess of the fourth semiconductor layer 19, the recess 22 of the active layer 21, and the recess of the fifth semiconductor layer 23 may have a shape corresponding to a shape of the recesses 18 formed in the third semiconductor layer 17. That is, as the recess 18 formed in the third semiconductor layer 17 has a V-pit shape, each of the recess of the fourth semiconductor layer 19, the recess of the active layer 21, and the recess of the fifth semiconductor layer 23 may have a V-pit shape.

As shown in FIG. 1, the lowest point of the recesses 18 of the third semiconductor layer 17 may be located at a bottom face of the third semiconductor layer 17.

The fourth semiconductor layer 19 may have a recess corresponding to the recess 18 of the third semiconductor layer 17. A partial region of the fourth semiconductor layer 19 may be disposed in recess 18 of the third semiconductor layer 17.

The active layer 21 may have a recess 22 corresponding to a recess 18 of the third semiconductor layer 17 or a recess of the fourth semiconductor layer 19.

A partial region of the active layer 21 may be disposed in the recess of the fourth semiconductor layer 19. Further, a partial region of the active layer 21 may be disposed in the recess 18 of the third semiconductor layer 17.

The fifth semiconductor layer 23 may have a recess corresponding to the recess 22 of the active layer 21. A partial region of the fifth semiconductor layer 23 may be disposed in the recess 22 of the active layer 21. Further, a partial region of the fifth semiconductor layer 23 may be disposed in the recess of the fourth semiconductor layer 19. In addition, a partial region of the fifth semiconductor layer 23 may be disposed in the recess 18 of the third semiconductor layer 17.

In one example, a partial region of the second semiconductor layer 25 may be disposed in recess of the fifth semiconductor layer 23. Further, a partial region of the second semiconductor layer 25 may be disposed in the recess 22 of the active layer 21. Further, a partial region of the second semiconductor layer 25 may be disposed in the recess of the fourth semiconductor layer 19. In addition, a partial region of the second semiconductor layer 25 may be disposed in the recess 18 of the third semiconductor layer 17. Accordingly, a partial region of the second semiconductor layer 25 may pass through the fifth semiconductor layer 23, the active layer 21 and the fourth semiconductor layer 19 and may be disposed in the recess 18 of the third semiconductor layer 17. In other words, a partial region of the second semiconductor layer 25 may extend through the fifth semiconductor layer 23, the active layer 21, the fourth semiconductor layer 19 and the third semiconductor layer 18.

In this case, the fourth and the fifth layers 107 and 109 which are identified based on the concentration of the second dopant therein may be disposed in the recess 22 of the active layer 21.

As will be explained below, as shown in FIG. 7, the fourth layer 107 may contain a second dopant. The fifth layer 109 may not contain the second dopant. However, the present disclosure is not limited thereto. Further, the concentration of the second dopant included in the fourth layer 107 may decrease in a direction from the top to the bottom of the active layer 21.

The second dopant of the fourth layer 107 may be the same as the dopant included in the second semiconductor layer 25. Further, the second dopant of the fourth layer 107 may be formed via diffusion of the dopant included in the second semiconductor layer 25 into the recess 22 of the active layer 21. However, the present disclosure is not limited thereto.

All of the lowest point of the recess of the fifth semiconductor layer 23, the lowest point of the recess 22 of the active layer 21, and the lowest point of the recess of the fourth semiconductor layer 19 may coincide with the lowest point of the recess 18 of the third semiconductor layer 17. In this case, the lowest point of the partial region of the second semiconductor layer 25 may contact a top face of the first semiconductor layer 15. However, the present disclosure is not limited thereto.

As shown in FIG. 1, a partial region of the fourth semiconductor layer 19, a partial region of the active layer 21 and a partial region of the fifth semiconductor layer 23 may not be disposed in the recess 18 formed in the third semiconductor layer 17. A partial region of the second semiconductor layer 25 may be disposed in the recess 18 formed in the third semiconductor layer 17. In this case, the partial region of the second semiconductor layer 25 may contact the bottom of the recess 18 formed in the third semiconductor layer 17.

The recess 18 may have a size or width that increases as the recess extends from a bottom of the third semiconductor layer 17 to a top thereof. A lateral face of the recess 18 may have a straight face. However, the present disclosure is not limited thereto.

The fourth semiconductor layer 19 may act as a strain relaxation layer (SRL) or a current spreading layer (CSL). The fourth semiconductor layer 19 may rapidly spread the current along a horizontal direction. The fourth semiconductor layer 19 may relax stress to prevent defects such as cracks in the semiconductor device 10.

The fifth semiconductor layer 23 may act as a carrier blocking layer (EBL). The fifth semiconductor layer 23 may prevent the first carrier injected from the first semiconductor layer 15 to the active layer 21 from passing through the active layer 21 and then moving to the second semiconductor layer 25.

Typically, mobility of the first carrier may be 10 to 1000 times higher than mobility of the second carrier. Therefore, a probability of non-light-emitting type recombination in which the first carrier injected from the first semiconductor layer 15 to the active layer 21 passes through the active layer 21 and then may be injected into the second semiconductor layer 25 and may be recombined with the second carrier therein may be higher than probability of light-emitting type recombination in which the first carrier injected from the first semiconductor layer 15 to the active layer 21 will be recombined with the second carrier injected from the second semiconductor layer 25 to the active layer 21. Thus, as the probability of the non-light-emitting type recombination in which the first carrier injected from the first semiconductor layer 15 to the active layer 21 passes through the active layer 21 and then may be injected into the second semiconductor layer 25 and may be recombined with the second carrier therein is higher, light generation efficiency may be lowered, and eventually the luminous intensity may be lowered.

Therefore, placing the fifth semiconductor layer 23 between the active layer 21 and the second semiconductor layer 25 may disallow the first carrier injected from the first semiconductor layer 15 to the active layer 21 to be moved to the second semiconductor layer 25, such that the luminous intensity may be increased.

These semiconductor layers, that is, the buffer layer 13, the first to fifth semiconductor layers 15, 25, 17, 19, and 23, and the active layer 21 may be disposed over a substrate 11. In other words, the buffer layer 13, the first semiconductor layer 15, the third semiconductor layer 17, the fourth semiconductor layer 19, the active layer 21, the fifth semiconductor layer 23, and the second semiconductor layer 25 may be sequentially grown over the substrate 11 using a deposition process. That is, the substrate 11 may be loaded in a chamber of a deposition apparatus, and then the buffer layer 13, the first semiconductor layer 15, the third semiconductor layer 17, the fourth semiconductor layer 19, the active layer 21, the fifth semiconductor layer 23, and the second semiconductor layer 25 are sequentially grown thereon. In this way, the semiconductor device 10 according to the first embodiment may be manufactured. Subsequently, the substrate 11 may be taken out of the chamber of the deposition apparatus.

The deposition apparatus may include, for example, a MOCVD (Metal Organic Chemical Vapor Deposition) apparatus, a CVD (Chemical Vapor Deposition) apparatus, a PECVD (Plasma-Enhanced Chemical Vapor Deposition) apparatus, a MBE (Molecular Beam Epitaxy) apparatus, and a HVPE (Hydride Vapor Phase Epitaxy) apparatus. However, the present disclosure is not limited thereto.

Material Characteristics of Semiconductor Device 10

Over the substrate 11, the buffer layer 13, the first semiconductor layer 15, the third semiconductor layer 17, the fourth semiconductor layer 19, the active layer 21, and the fifth semiconductor layer 23, and the second semiconductor layer 25 may be grown over a substrate. The substrate may support the buffer layer 13, the first semiconductor layer 15, the third semiconductor layer 17, the fourth semiconductor layer 19, the active layer 21, the fifth semiconductor layer 23, and the second semiconductor layer 25 thereon.

To those ends, the substrate 11 may be made of a material suitable for growth of a group III-V compound semiconductor material or a group II-VI compound semiconductor material. The substrate 11 may be made of, for example, a material having at least thermal stability, and a similar lattice constant to that of the first semiconductor layer 15.

For example, the substrate 11 may be a conductive substrate or an insulating substrate. For example, the substrate 11 may be made of at least one selected from a group consisting of sapphire ($Al_2O_3$), SiC, Si, GaAs, GaN, ZnO, GaP, InP, and Ge.

The buffer layer 13 may be disposed on the substrate 11. The buffer layer 13 may play a role in reducing a difference between lattice constants of the substrate 11 and the first semiconductor layer 15. Since the difference between the lattice constants of the substrate 11 and the first semiconductor layer 15 is reduced using the buffer layer 13, the first semiconductor layer 15, the third semiconductor layer 17, the fourth semiconductor layer 19, the active layer 21, the fifth semiconductor layer 23, and the second semiconductor layer 25 may be stably grown on the substrate 11 while defects are not created. The buffer layer 13 may include a group III-V compound semiconductor material or a group I-VI compound semiconductor material.

The first semiconductor layer 15 may be disposed on the buffer layer 13. When the buffer layer 13 is omitted, the first semiconductor layer 15 may be disposed on the substrate 11.

The first semiconductor layer 15 may be made of a compound semiconductor material of $Al_xIn_yGa_{(1-x-y)}N$ ($0 \leq x \leq 1$, $0 \leq y \leq 1$, $0 \leq x+y \leq 1$). However, the present disclosure is not limited thereto. For example, the first semiconductor layer 15 may include at least one selected from a group consisting of InAlGaN, GaN, AlGaN, InGaN, AlN, InN, AlInN, GaAs, AlGaAs, GaAsP GaP, InP, GaInP, and AlGaInP. However, the present disclosure is not limited thereto.

The first semiconductor layer 15 may have a thickness of about 1 m to about 10 μm.

The first semiconductor layer 15 may contain n-type dopants such as Si, Ge, Sn, Se, and Te. A doping concentration thereof, for example, a silicon (Si) concentration in the first semiconductor layer 15 may be in a range of about $5\times10^{18}$ cm$^{-3}$ to about $3\times10^{19}$ cm$^{-3}$. In this concentration range, an operation voltage, and an epitaxy quality may be improved.

The first semiconductor layer 15 may feed the first carrier to the active layer 21.

The first semiconductor layer 15 may include carbon (C). A carbon (C) concentration in the first semiconductor layer 15 may be $1\times10^{16}$ cm$^{-3}$ to $4\times10^{16}$ cm$^{-3}$. When the carbon (C) concentration in the first semiconductor layer 15 may be $1\times10^{16}$ cm$^{-3}$ or greater, the reliability of the semiconductor device may be improved. When the carbon (C) concentration in the first semiconductor layer 15 may be $4\times10^{16}$ cm$^{-3}$ or lower, the operating voltage thereof may be improved in this concentration range.

The third semiconductor layer 17 may be disposed on the first semiconductor layer 15. The fourth semiconductor layer 19 may be disposed on the third semiconductor layer 17.

Each of the third semiconductor layer 17 and the fourth semiconductor layer 19 may be made of a compound semiconductor material of $Al_xIn_yGa_{(1-x-y)}N$ (0≤x≤1, 0≤y≤1, 0≤x+y≤1). However, the present disclosure is not limited thereto.

Each of the third semiconductor layer 17 and the fourth semiconductor layer 19 may have a superlattice structure composed of a plurality of layers. For example, each of the third semiconductor layer 17 and the fourth semiconductor layer 19 may include an InGaN/GaN stack structure or an InGaN/AlGaN stack structure. However, the present disclosure is not limited thereto.

An indium (In) content of the third semiconductor layer 17 may be in a range of about 1% to about 3%. In this content range, the recess 18 such as the V-pit may be more easily formed, and a film having an uniform thickness may be obtained.

When the fourth semiconductor layer 19 acts as a stress relaxation layer, an indium (In) content therein may be in a range of about 3% to about 6%. The current may be quickly spread in this content range.

When the fourth semiconductor layer 19 acts as the current spreading layer, the indium (In) content therein may be in a range of about 6% to about 12%. The stress may be relaxed in this content range. Further, defects such as cracks may be suppressed in the semiconductor device 10 in this content range.

The fourth semiconductor layer 19 may act as only one of the stress relaxation layer and the current spreading layer. Alternatively, the fourth semiconductor layer 19 may act as both the stress relaxation layer and the current spreading layer.

A thickness of the third semiconductor layer 17 may be in a range of about 130 nm to about 170 nm.

The third semiconductor layer 17 may contain n-type dopants such as Si, Ge, Sn, Se, and Te. A doping concentration, for example, a silicon (Si) concentration in the third semiconductor layer 17 may be in a range of about $8\times10^{17}$ cm$^{-3}$ to about $2\times10^{18}$ cm$^{-3}$. In this concentration range, the operation voltage, and the epitaxy quality may be improved.

The fourth semiconductor layer 19 may include n-type dopants such as Si, Ge, Sn, Se, and Te. A doping concentration, for example, a silicon (Si) concentration in the fourth semiconductor layer 19 may be in a range of about $1\times10^{17}$ cm$^{-3}$ to about $1\times10^{18}$ cm$^{-3}$. In this concentration range, the operation voltage, and the epitaxy quality may be improved.

The third semiconductor layer 17 may contain carbon (C). A carbon concentration in the third semiconductor layer 17 may be in a range of about $6\times10^{16}$ cm$^{-3}$ or lower. The operating voltage may be improved in this concentration range.

The fourth semiconductor layer 19 may contain carbon (C). A carbon concentration in the fourth semiconductor layer 19 may be in a range of about $6\times10^{16}$ cm$^{-3}$ or lower. The operating voltage may be improved in this concentration range.

A ratio between the carbon concentration and the silicon (Si) concentration in the third semiconductor layer 17 may be in a range of about 1:80 to about 1:200.

When the ratio between the carbon concentration and the silicon concentration is 1:80 or greater, electrical resistance of the carbon may be canceled by the silicon (Si), so that the operation voltage may be improved. When the ratio between the carbon concentration and the silicon concentration is 1:200 or smaller, movement of the first carrier generated in the first semiconductor layer 15 may not be disturbed by the silicon (Si), such that the luminous intensity may be increased.

Although not shown, an electron injection layer that facilitates injection of the first carrier generated in the first semiconductor layer 15 into the active layer 21 may be further disposed between the third semiconductor layer 17 and the active layer 21 or between the fourth semiconductor layer 19 and the active layer 21.

The active layer 21 may be disposed on the first semiconductor layer 15, the third semiconductor layer 17 or the fourth semiconductor layer 19.

The active layer 21 may perform electro luminescence (EL) in which an electrical signal applied across the first semiconductor layer 15 and the second semiconductor layer 25 is converted into light. That is, the active layer 21 may generate light of a specific wavelength region in response to the electrical signal. The light of the specific wavelength region may not be generated by itself but may be generated only when the electrical signal is applied across the first semiconductor layer 15 and the second semiconductor layer 25.

The active layer 21 may include one of a multi-quantum well structure (MQW), a quantum dot structure, or a quantum wire structure. The active layer 21 may include a stack structure in which a well layer and a barrier layer may be repeatedly alternately stacked one on top of the other.

A repeating number of the well layer and the barrier layer may be modified based on characteristics of the semiconductor device 10. However, the present disclosure is not limited thereto. For example, the repeating number of the well layer and the barrier layer may be in a range of 1 to 20. However, the present disclosure is not limited thereto.

The active layer 21 may include the well layer/the barrier layer such as InGaN/InGaN, InGaN/GaN, or InGaN/AlGaN.

An indium (In) content in the active layer 21 may be in a range of about 12% to about 16%. Light of a main light-emitting peak wavelength, for example, blue wavelength light may be generated in the content range.

The well layer may have a thickness of about 1 nm to about 10 nm, and the barrier layer may have a thickness of about 1 nm to about 20 nm.

The p-type dopant may be contained in the well layer and/or the barrier layer of the active layer 21.

The fifth semiconductor layer 23 may be disposed on the active layer 21. The fifth semiconductor layer 23 may be made of a compound semiconductor material of $Al_xIn_yGa_{(1-x-y)}N$ ($0 \le x \le 1$, $0 \le y \le 1$, $0 \le x+y \le 1$). However, the present disclosure is not limited thereto.

The fifth semiconductor layer 23 may have a superlattice structure composed of a plurality of layers. For example, the fifth semiconductor layer 23 may include a repetition of a stack structure such as a repetition of an AlGaN/GaN stack structure. However, the present disclosure is not limited thereto.

For example, an aluminum (Al) content in the fifth semiconductor layer 23 may be in a range of about 15% to about 24%. In this content range, blocking performance of the first carrier may be improved, and the injection efficiency in which the second carrier of the second semiconductor layer 25 is injected into the active layer 21 may be improved.

The fifth semiconductor layer 23 may contain p-type dopants such as Mg, Zn, Ca, Sr, and Ba. A doping concentration, for example, the concentration of the second dopant in the fifth semiconductor layer 23 may be in a range of about $5 \times 10^{18}$ cm$^{-3}$ to about $1 \times 10^{20}$ cm$^{-3}$. The operation voltage may be improved, and the light output may be improved in this doping concentration range.

Although not shown, a hole injection layer that facilitates injection of the second carrier generated in the second semiconductor layer 25 into the active layer 21 may be further disposed between the active layer 21 and the fifth semiconductor layer 23. For example, the hole injection layer may include GaN. However, the present disclosure is not limited thereto.

The second semiconductor layer 25 may be disposed on the active layer 21 or the fifth semiconductor layer 23. The second semiconductor layer 25 may feed the second carrier to the active layer 21.

The second semiconductor layer 25 may be made of a compound semiconductor material of $Al_xIn_yGa_{(1-x-y)}N$ ($0 \le x \le 1$, $0 \le y \le 1$, $0 \le x+y \le 1$). However, the present disclosure is not limited thereto. For example, the second semiconductor layer 25 may include at least one selected from a group consisting of InAlGaN, GaN, AlGaN, InGaN, AlN, InN, AlInN, GaAs, AlGaAs, GaAsP GaP, InP, GaInP, and AlGaInP. However, the present disclosure is not limited thereto.

The second semiconductor layer 25 may have a thickness of about 1 m or smaller.

The second semiconductor layer 25 may contain p-type dopants such as Mg, Zn, Ca, Sr, and Ba. A doping concentration, for example, a concentration of the second dopant in the second semiconductor layer 25 may be in a range of about $5 \times 10^{18}$ cm$^{-3}$ to about $5 \times 10^{20}$ cm$^{-3}$. The operation voltage may be improved, and the light output may be improved in this doping concentration range.

Detailed Structure of Third Semiconductor Layer

Figure 2:
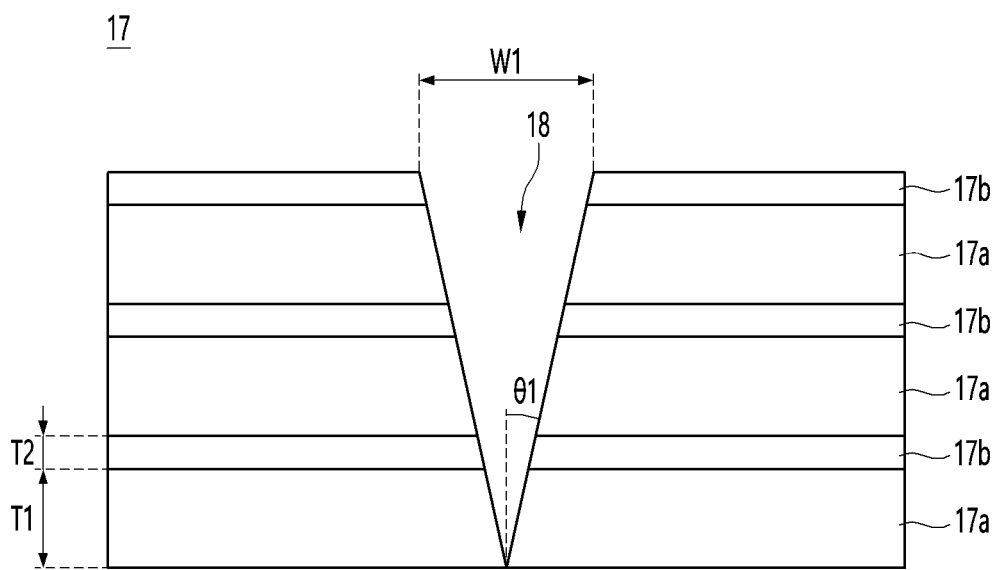
FIG. 2 shows a third semiconductor layer in detail.

FIG. 2 shows the third semiconductor layer in detail.

Referring to FIG. 2, the third semiconductor layer 17 may be composed of a first pair, a second pair, and a third pair. However, the present disclosure is not limited thereto. In other words, the third semiconductor layer 17 may be composed of at least four pairs.

Each of the first pair, the second pair, and the third pair may include a first sub-semiconductor layer 17a and a second sub-semiconductor layer 17b. Accordingly, a top face of the second sub-semiconductor layer 17b of the first pair may be in contact with a bottom face of the first sub-semiconductor layer 17a of the second pair. A top face of the second sub-semiconductor layer 17b of the second pair may contact a bottom face of the first sub-semiconductor layer 17a of the third pair.

For example, a bottom face of the first sub-semiconductor layer 17a of the first pair may be in contact with a top face of the first semiconductor layer 15, a top face of the second sub-semiconductor layer 17b of the third pair may contact a bottom face of the fourth semiconductor layer 19. However, the present disclosure is not limited thereto.

For example, the first sub-semiconductor layer 17a may made of GaN. For example, the second sub-semiconductor layer 17b may be made of InGaN. That is, the indium (In) may be contained in the first sub-semiconductor layer 17a. The indium (In) may not be contained in the second sub-semiconductor layer 17b. Accordingly, the indium (In) may be contained in the third semiconductor layer 17 periodically, for example, on a pair basis.

The third semiconductor layer 17 may be grown on the first semiconductor layer 15 at a temperature of about 830° C. to about 870° C.

For example, in a state in which trimethylgallium (TMG) gas, and nitrogen (N$_2$) gas are injected into the chamber of the MOCVD apparatus, the indium (In) may be periodically injected thereto. Thus, the first sub-semiconductor layers 17a, and the second sub-semiconductor layer 17b of each of the first pair, the second pair, and the third pair may be grown. While the indium (In) is not injected thereto, the first sub-semiconductor layer 17a made of GaN may be grown using the TMG gas, and the nitrogen gas. Subsequently, while the indium (In) is injected thereto, the second sub-semiconductor layer 17b made of InGaN may be grown using a mixture of the indium (In) with the TMG gas, and the nitrogen gas.

For example, a thickness T1 of the first sub-semiconductor layer 17a may be in a range of about 15 nm to about 40 nm. For example, a thickness T2 of the second sub-semiconductor layer 17b may be in a range of about 2 nm to about 5 nm.

A ratio between the thickness of the second sub-semiconductor layer 17b and the thickness of the first sub-semiconductor layer 17a may be in a range of about 1:3 to about 1:8. In this thickness range, a growth rate in vertical and horizontal directions of the third semiconductor layer 17 may be controlled, so that the recess 18 such as the V-pit may be easily formed.

The lowest point of the recess 18 may coincide with the bottom face of the first sub-semiconductor layer 17a of the first pair.

For example, an angle between a normal line and an inclined lateral face of the recess 18 may be defined as an inclination angle $\theta_1$. The inclination angle $\theta_1$ may be 5 to 30°. When the inclination angle $\theta_1$ is greater than or equal to 5°, the luminous intensity of light emitted from the semiconductor device may be increased. When the inclination angle $\theta_1$ is greater than or equal to 30°, this may be preferable in terms of the luminous intensity. However, there is a limitation in increasing the inclination angle $\theta_1$ relative to a thickness of the third semiconductor layer 17.

When the ratio between the thickness of the second sub-semiconductor layer 17b and the thickness of the first sub-semiconductor layer 17a is smaller than 1:3 or is greater than 1:8, an arrangement density of the recesses 18 or the inclination angle of the inclined face of the recess 18 may change, resulting in deterioration of the light output, the operation voltage, and ESD (Electro Static Discharge) characteristics of the semiconductor device 10. The arrangement density thereof may refer to a distribution probability of the recesses 18.

In FIG. 2, the recess 18 is shown to start to extend from the second sub-semiconductor layer 17b of the first pair. However, the present disclosure is not limited thereto. A starting position of the extension of the recess 18 or a bottom position of thereof may vary.

The recess 18 of the third semiconductor layer 17 may improve the electrical and optical characteristics of the semiconductor device 10. However, when the recesses 18 are highly densely arranged, that is, when the arrangement density of the recess 18 is excessive, the electrical and optical characteristics, and reliability of the semiconductor device 10 may be deteriorated. Therefore, controlling the arrangement density of the recesses 18, and the size of the recess 18 may allow improving the optical and electrical characteristics of the semiconductor device 10, and securing the reliability thereof.

As shown in FIG. 2, a width Wi or a size of the recess 18 may increase as the recess extends from a bottom to a top of the third semiconductor layer 17. In this case, in the topmost region of the second sub-semiconductor layer 17b of the third pair, a maximum width Wi of the recess 18 may be obtained.

The first semiconductor layer 15 may be grown, for example, at a temperature of about 1000° C. to 1,100° C. In this case, the third semiconductor layer 17 may be grown at a temperature (that is, about 830° C. to about 870° C.) lower than the growth temperature of the first semiconductor layer 15. Further, the first and second sub-semiconductor layers 17a and 17b included in each pair of the third semiconductor layer 17 may be grown to have different thicknesses from each other. In addition, the indium (In) may be selectively contained in the first and second sub-semiconductor layers 17a and 17b of each pair of the third semiconductor layer 17. Therefore, as the first sub-semiconductor layer 17a and the second sub-semiconductor layer 17b of the third semiconductor layer 17 are periodically grown while performing the temperature adjustment, the thickness adjustment, and the adjustment of the indium (In) content, the formation of the recess 18 such as the V-pit may be facilitated and may be precisely controlled.

Detailed Structure of Fifth Semiconductor Layer

Figure 3:
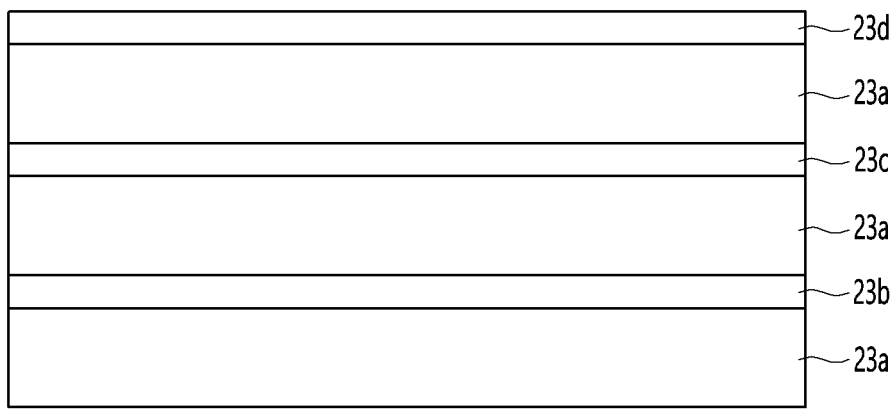
FIG. 3 shows a fifth semiconductor layer in detail.

FIG. 3 shows the fifth semiconductor layer in detail.

Referring to FIG. 3, the fifth semiconductor layer 23 may be composed of a first pair, a second pair, and a third pair. However, the present disclosure is not limited thereto.

Each of the first pair, the second pair, and the third pair may include a first sub-semiconductor layer 23a and each of second sub-semiconductor layers 23b, 23c and 23d. Accordingly, a top face of the second sub-semiconductor layer 23b of the first pair may be in contact with a bottom face of the first sub-semiconductor layer 23a of the second pair. a top face of the second sub-semiconductor layer 23c of the second pair may contact the bottom face of the first sub-semiconductor layer 23a of the third pair.

For example, a bottom face of the first sub-semiconductor layer 23a of the first pair may be in contact with a top face of the active layer 21. A top face of the second sub-semiconductor layer 23d of the third pair may contact a bottom face of the second semiconductor layer 25. However, the present disclosure is not limited thereto.

For example, the first sub-semiconductor layer 23a may be made of GaN. Each of the second sub-semiconductor layers 23b, 23c, and 23d may be made of AlGaN.

Aluminum (Al) contents in the second sub-semiconductor layers 23b, 23c, and 23d of the first pair, the second pair, and the third pair respectively may be different from each other.

For example, the second sub-semiconductor layer 23b of the first pair may include an $Al_xGa_{1-x}N/GaN$ stack, the second sub-semiconductor layer 23c of the second pair may include $Al_yGa_{1-y}N$, and the second sub-semiconductor layer 23d of the third pair may include $Al_zGa_{1-z}N$. In this case, a relationship between x, y, and z may satisfy following Equation 1 and Equation 2.

$$y = x - 0.03, \quad \text{[Equation 1]}$$

$$z = y - 0.03 \quad \text{[Equation 2]}$$

x may be in a range of 0.21 to 0.24.

For example, when x is 0.24, the aluminum (Al) content of the second sub-semiconductor layer 23b of the first pair may be 24%, the aluminum (Al) content of the second sub-semiconductor layer 23c of the second pair may be 21%, and the aluminum (Al) content of the second sub-semiconductor layer 23d of the third pair may be 18%.

For example, when x is 0.21, the aluminum (Al) content of the second sub-semiconductor layer 23b of the first pair may be 21%, the aluminum (Al) content of the second sub-semiconductor layer 23c of the second pair may be 18%, the aluminum (Al) content of the second sub-semiconductor layer 23d of the third pair may be 15%.

Accordingly, each of the aluminum (Al) contents of the second sub-semiconductor layers 23b, 23c, and 23d of the first pair, the second pair, and the third pair respectively of the fifth semiconductor layer 23 may be adjusted to a value in a range of about 15% to about 24%. In this content range, the blocking performance of the first carrier may be improved, and the injection efficiency in which the second carrier of the second semiconductor layer 25 is injected into the active layer 21 may be improved.

Figure 4:
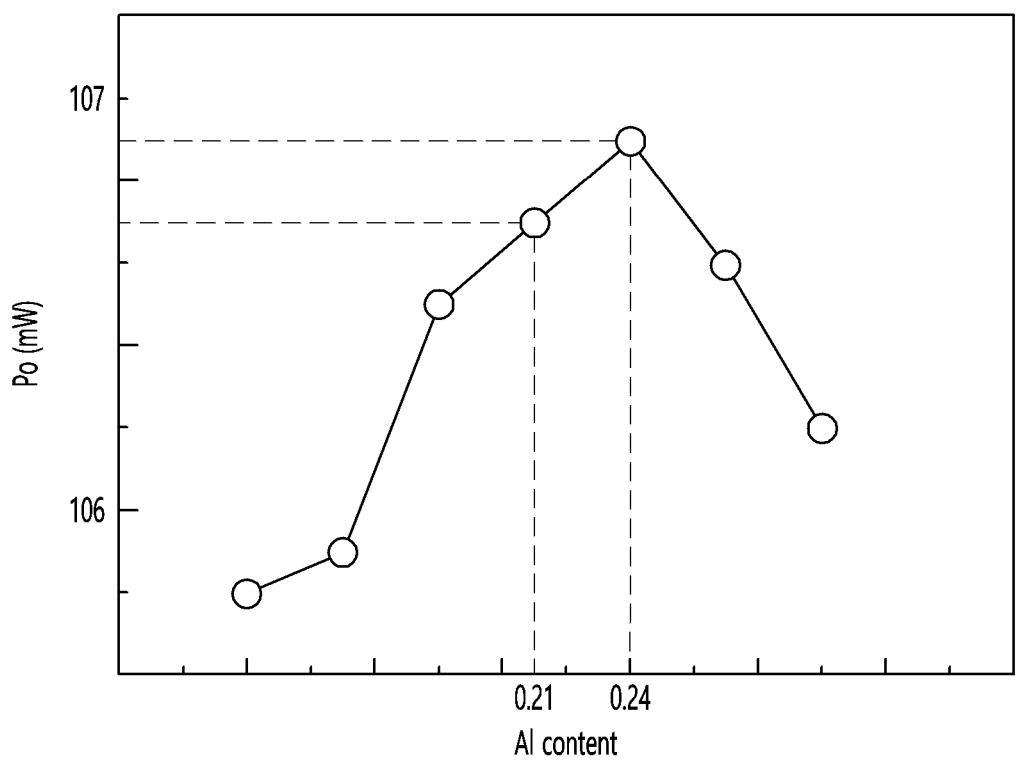
FIG. 4 shows luminous intensity based on an aluminum Al content of the fifth semiconductor layer.

The luminous intensity Po of the semiconductor device 10 varies depending on the aluminum (Al) content, as shown in FIG. 4.

FIG. 4 shows the luminous intensity based on the aluminum (Al) content of the fifth semiconductor layer.

Referring to FIG. 4, it may be identified that when the aluminum (Al) content is 24%, the luminous intensity Po is the highest. It may be identified that when the aluminum (Al) content is smaller or greater than 24%, the luminous intensity Po is lowered.

The aluminum (Al) content of the second sub-semiconductor layer 23b of the first pair may be in a range of about 21% to 24%. The aluminum (Al) content of the second sub-semiconductor layer 23c of the second pair may be in a range of about 18% to about 21%. The aluminum (Al) content of the second sub-semiconductor layer 23d of the third pair may be in a range of about 15% to about 18%. As described above, the aluminum (Al) contents of the second sub-semiconductor layers 23c, and 23d of the second pair, and the third pair respectively may be determined based on the above Equation 1 and Equation 2.

When the aluminum (Al) content is smaller than 21%, the first carrier overflows from the active layer 21 to the second semiconductor layer 25, such that light loss may occur due to leakage current. When the aluminum (Al) content exceeds 24%, the second carrier is not easily injected from the second semiconductor layer 25 into the active layer 21, such that the operation voltage may increase.

In one example, a deep hole injection effect may be achieved using the recess 22 formed in the active layer 21.

Figure 5:
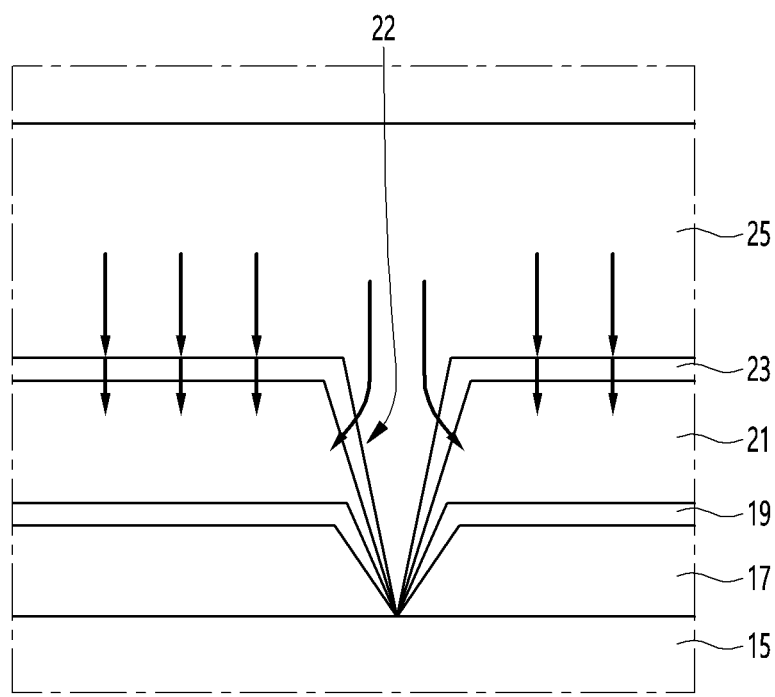
FIG. 5 shows a deep hole injection in a semiconductor device according to an embodiment.

FIG. 5 shows a deep hole injection in a semiconductor device according to an embodiment.

As shown in FIG. 5 and FIG. 7, the active layer 21 may have the recess 22. The recess 22 in the active layer 21 may be formed in a corresponding manner to the recess 18 formed in the third semiconductor layer 17.

The fifth semiconductor layer 23 and the second semiconductor layer 25 may be sequentially disposed over the active layer 21.

A partial region of the second semiconductor layer 25 may be disposed in the fourth layer 107. That is, the fourth layer 107 and the fifth layer 109 may be disposed in the recess 21.

When an electrical signal is applied, the second carrier of the second semiconductor layer 25 may be injected into the active layer 21. As described above, the fifth semiconductor layer 23 blocks the first carrier of the first semiconductor layer 15 from being moved to the second semiconductor layer 25 through the active layer 21, while the fifth semiconductor layer 23 allows the second carrier of the second semiconductor layer 25 to be easily injected to the active layer 21.

The second carrier of the second semiconductor layer 25 may be injected from the second semiconductor layer 25 to the active layer 21.

In addition, the second carrier may be generated in the fourth layer 107 disposed in the recess 22. The second carrier generated in the fourth layer 107 disposed in the recess 22 may also be injected into the active layer 21 through the inclined face of the fourth layer 107.

As described above, the mobility of the first carrier is much higher than that of the second carrier, such that the first carrier may be injected into the active layer 21 in a larger amount than the second carrier may be, for the same time duration. In this case, only an amount of the first carrier corresponding to the same amount of the second carrier contributes to light generation via recombination therebetween, such that many first carriers are not recombined with the second carrier injected from the second semiconductor layer 25.

However, in one embodiment, not only the second carrier of the second semiconductor layer 25 may be injected into the active layer 21 in the vertical direction, but also the second carriers may be injected into the active layer 21 through the inclined face of the fourth layer 107. Thus, the second carriers may be injected into the active layer 21 in a larger amount.

Therefore, the second carriers may be injected into the active layer 21 in the increased amount to increase the recombination amount between the first carrier and the second carrier for the same time duration, thereby improving light efficiency and increasing luminous intensity.

In general, a recess such as a V-pit is exceedingly small. Thus, it is difficult to identify whether the recess exists in the corresponding semiconductor device.

In one embodiment, the recess may be easily identified based on change in the concentration of the dopant of the second semiconductor layer 25. Further, the size or the depth of the recess may be identified based on change in the concentration of the dopant of the second semiconductor layer 25.

The recess identification method will be described in detail with reference to FIG. 6 to FIG. 8.

Figure 6:
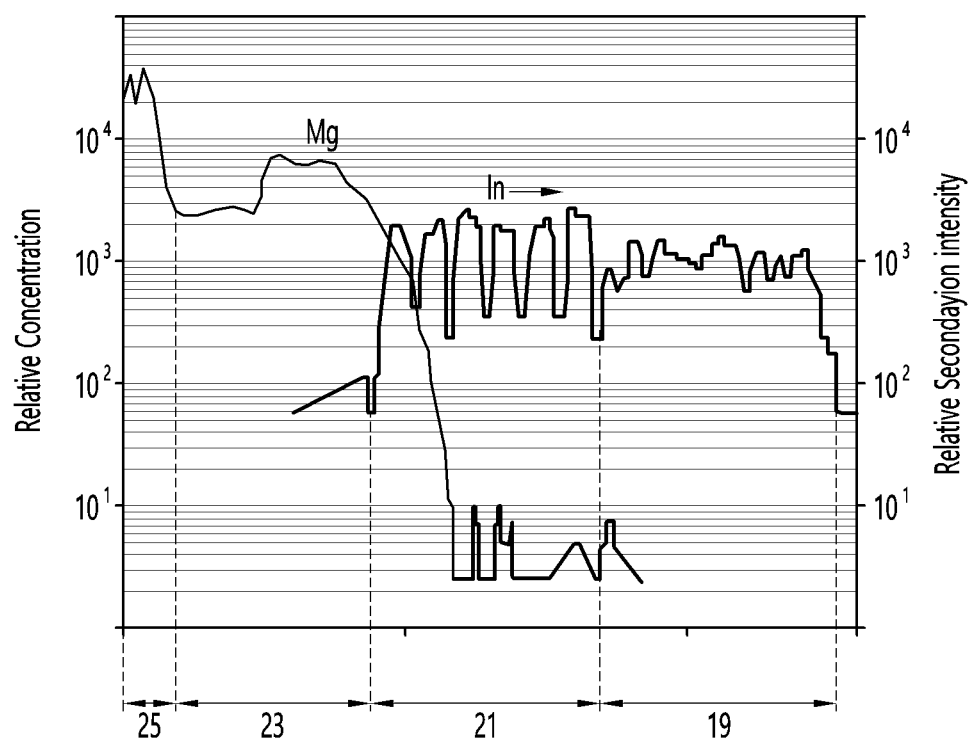
FIG. 6 shows a second carrier profile when each of the third semiconductor layer, a fourth semiconductor layer, an active layer and the fifth semiconductor layer is free of a recess.
Figure 8:
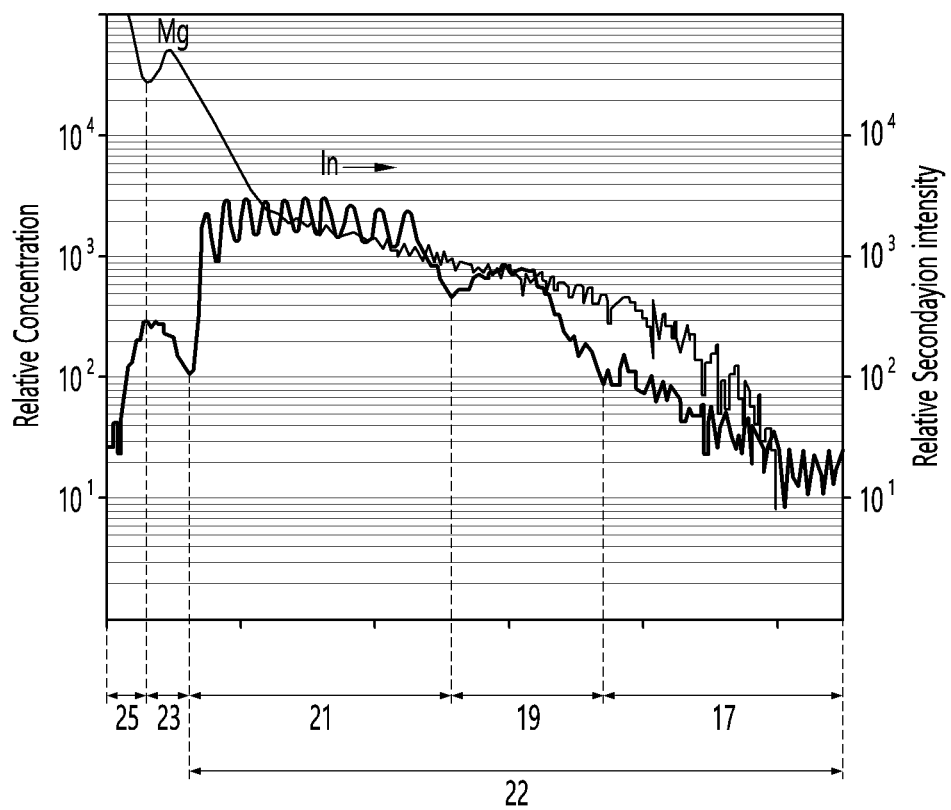
FIG. 8 shows a second carrier profile when a density of recesses is excessive.

As shown in FIG. 6 to FIG. 8, the composition or the doping concentration of each layer of the semiconductor device 10 as manufactured as described above may be detected using the ion detection method using a secondary ion analysis device.

FIG. 6 shows a second carrier profile when each layer, that is, each of the third semiconductor layer 17, the fourth semiconductor layer 19, the active layer 21 and the fifth semiconductor layer 23 is free of the recess.

FIG. 7 shows the second carrier profile when each layer has the recess. FIG. 8 shows the second carrier profile when the density of the recesses is excessive. Magnesium may be used as the second carrier for the second carrier profile. However, the present disclosure is not limited thereto. That is, another p-type dopant doped into the second semiconductor layer 25 may be applied as the second carrier.

As described above, each of the fifth semiconductor layer 23 and the second semiconductor layer 25 may include the p-type dopant such as the magnesium.

In this case, as shown in FIG. 6, the concentration of the second dopant has a significant value in each of the fifth semiconductor layer 23 and the second semiconductor layer 25. However, the second dopant does not exist in the layers below the second semiconductor layer 25, that is, the active layer 21, the fourth semiconductor layer 19 and the like.

In particular, when the recess 18 is not formed in the third semiconductor layer 17, the recesses may not be formed in the fourth semiconductor layer 19, the active layer 21 and the fifth semiconductor layer 23 disposed over the third semiconductor layer 17. In this case, when measuring the secondary ions using a secondary ion analysis device, the concentration of the second dopant in the active layer 21 and the fourth semiconductor layer 19 disposed below the second semiconductor layer 25 may be zero.

Therefore, this scheme may easily identify whether the recess is not formed in the layer of the semiconductor device 10 using the secondary ion analysis device.

To the contrary, as shown in FIG. 7, the concentration of the second dopant in the second semiconductor layer 25 disposed in the fourth layer 107, that is, the fourth layer 107 may be detected.

As shown in FIG. 1, the recess 22 recessed from the top face of the active layer 21 may be formed and the second semiconductor layer 25 may be disposed in the recess 22. Thus, a portion of the second semiconductor layer 25 in the fourth layer 107 may have the same vertical level as that of the active layer 21.

Therefore, the concentration of the second dopant may be detected in the fourth layer 107 disposed in the recess 22 in the active layer 21 and the fourth layer 107 positioned on the same line. However, the magnesium may not be detected in a remaining region of the active layer 21 except for the recess 22.

As shown in FIG. 7, the concentration of the second dopant detected in the fourth layer 107 may be decreased along the thickness direction of the active layer 21, that is, the vertical direction. In other words, the concentration of the second dopant in the fourth layer 107 may decrease in a direction from the top to the bottom of the active layer 21. That is, the concentration of the second dopant of the fourth layer 107 in the recess 22 may decrease in a direction from the top to the bottom of the active layer 21.

The concentration of the second dopant in the fourth layer 107 may have a gradient. The gradient of the concentration of the second dopant may vary depending on the shape of the fourth layer 107. That is, the gradient of the concentration of the second dopant may vary depending on a size (or an area) or a depth of the recess 22 and/or a size or a depth of the fourth layer 107 disposed in the recess 22.

For example, when the depth of the fourth layer 107 is constant, the gradient of the concentration of the second dopant may decrease as the size of the fourth layer 107 decreases along the thickness direction of the active layer 21.

Figure 9A:
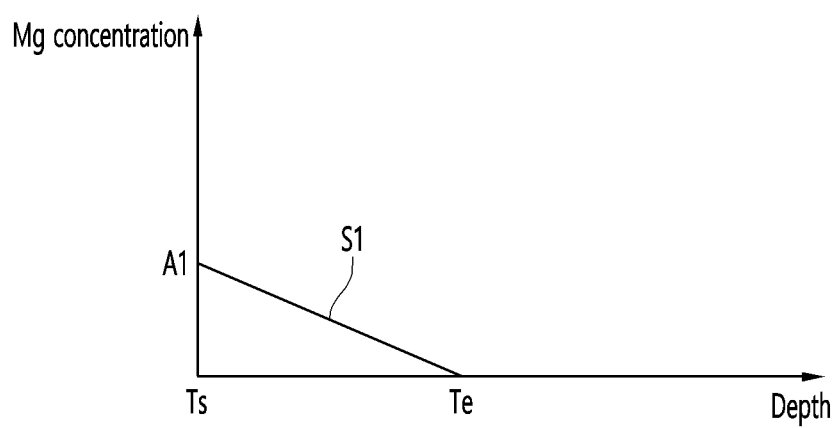
FIGS. 9A and 9B show a gradient of a magnesium concentration based on a size of a topmost region of the recess in the active layer.
Figure 9B:
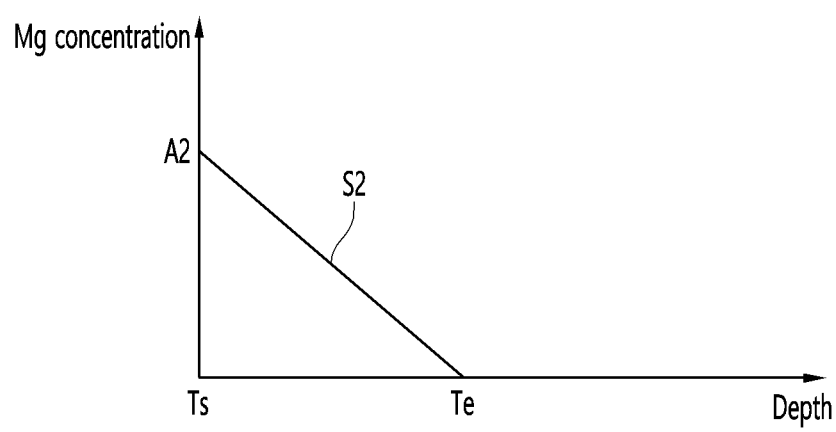

FIG. 9 shows the gradient of the concentration of the second dopant based on the size of the top region of recess 22, that is, the topmost region of the fourth layer 107. In FIG. 9a, a size of the topmost region Ts of the fourth layer 107 may be X1, and in FIG. 9b, a size of the topmost region Ts of the fourth layer 107 may be X2, and X2 may be greater than X1. The size may refer to an area of the topmost region Ts of the fourth layer 107 disposed in the recess 22.

The topmost region Ts of the fourth layer 107 may have the same vertical level as that of a last well layer of the active layer 21. However, the present disclosure is not limited thereto. The last well layer of the active layer 21 may be adjacent to the second semiconductor layer 25 when the fifth semiconductor layer 23 or the fifth semiconductor layer 23 is omitted.

As shown in FIG. 9a, when a size of the topmost region Ts of the fourth layer 107 is X1, the concentration of the second dopant detected in the topmost region Ts of the fourth layer 107 may be A1, and the concentration of the second dopant may be reduced with staring from the topmost region Ts of the fourth layer 107, so that the concentration of the second dopant may be zero in the bottommost region Te of the fourth layer 107. A dimension between the top region and the bottom region may be defined as a depth of the fourth layer 107. The bottommost region Te of the fourth layer 107 may be a bottom point of the fourth layer 107. Therefore, the gradient when the size of the topmost region Ts of the fourth layer 107 is X1 may be expressed as a following Equation 3.

$$s1 = A1/(Ts-Te) \quad [\text{Equation 3}]$$

As shown in FIG. 9b, when the size of the topmost region Ts of the fourth layer 107 is X2, the concentration of the second dopant detected in the topmost region Ts of the fourth layer 107 may be A2, and the concentration of the second dopant may be reduced with staring from the topmost region Ts of the fourth layer 107, so that the concentration of the second dopant detected in the bottommost region Te of the fourth layer 107 may be zero. Therefore, the gradient when the size of the topmost region Ts of the fourth layer 107 is X2 may be expressed as a following Equation 4.

$$s2 = A2/(Ts-Te) \quad [\text{Equation 4}]$$

The gradient of the concentration of the second dopant calculated from the Equation 3 and the Equation 4 may vary based on the size of the topmost region Ts of the fourth layer 107.

When the depth of the fourth layer 107 is constant, the gradient of the concentration of the second dopant detected in the fourth layer 107 may be increased as the size of the topmost region Ts of the recess 22 increases. That is, a second gradient s2 may be greater than a first gradient S1s1.

This is because as the size of the topmost region Ts of the fourth layer 107 increases, the concentration of the second dopant detected in the topmost region Ts having the increased size increases.

In addition, when the size of the topmost region Ts of the fourth layer 107 is constant, the gradient of the concentration of the second dopant may vary depending on the depth of the fourth layer 107.

For example, the gradient of the concentration of the second dopant may increase as the depth of the fourth layer 107 decreases along the thickness direction of the active layer 21.

Figure 10A:
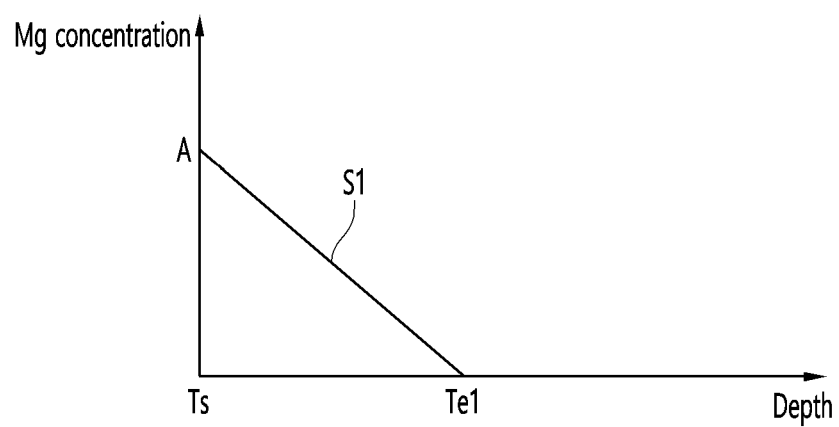
FIGS. 10A and 10B show a gradient of a magnesium concentration based on a depth of the recess in the active layer.

FIG. 10 shows the gradient of the concentration of the second dopant based on the depth of the recess in the active layer. In FIG. 10a, the depth of the fourth layer 107 may be (Ts-Te1), and in FIG. 9b, the depth of the fourth layer 107 may be (Ts-Te2), and (Ts-Te2) may be greater than (Ts-Te1).

As shown in FIG. 10a, when the depth of the fourth layer 107 is (Ts-Te1), the concentration of the second dopant may decrease from A to zero in a direction from the topmost region Ts of the fourth layer 107 to the lowest region Te1 of the fourth layer 107. The first depth (Ts-Te1) may be the distance between the topmost region Ts of the fourth layer 107 and the lowest region Te1 of the fourth layer 107. When the depth of the fourth layer 107 is the first depth (Ts-Te1), the gradient may be expressed as a following Equation 5.

$$s1 = A/(Ts-Te1) \quad [\text{Equation 5}]$$

Figure 10B:
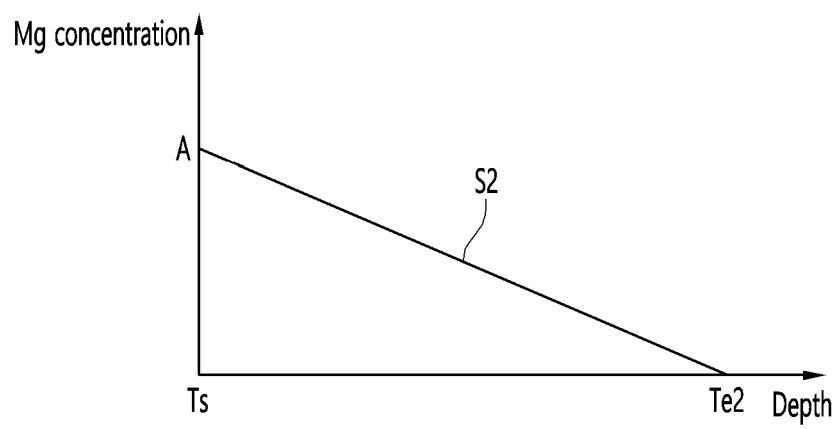

As shown in FIG. 10b, when the depth of the fourth layer 107 is (Ts-Te2), the concentration of the second dopant may decrease from A to zero in a direction from the topmost region Ts of the fourth layer 107 to the bottommost region Te2 of the fourth layer 107. The second depth (Ts-Te2) may be a distance between the topmost region Ts of the fourth layer 107 and the lowest region Te2 of the fourth layer 107. When the depth of the fourth layer 107 is the second depth (Ts-Te2), the gradient may be expressed as a following Equation 6.

$$s2 = A/(Ts-Te2) \quad [\text{Equation 6}]$$

The gradient of the concentration of the second dopant calculated from the Equation 5 and Equation 6 may vary based on the distance between the top region Ts of the fourth layer 107 and the bottom region Te of the fourth layer 107.

When the size of the topmost region Ts of the fourth layer 107 is constant, the gradient of the concentration of the second dopant detected in the fourth layer 107 may be increased as the distance between the topmost region Ts of the fourth layer 107 and the bottommost region Te of the fourth layer 107 is smaller. That is, the first gradient s1 may be greater than the second gradient s2.

In an embodiment, the concentration of the second dopant in the topmost region Ts of the fourth layer 107 may be in a range of $5 \times 10^{17}$ cm$^{-3}$ to $1 \times 10^{19}$ cm$^{-3}$. Specifically, the concentration of the second dopant in the topmost region Ts of the fourth layer 107 may be $1 \times 10^{18}$ cm$^{-3}$. When the concentration of the second dopant in the topmost region Ts is $5 \times 10^{17}$ cm$^{-3}$ or greater, a production amount of the second carrier may be increased, so that the light-emitting efficiency of the active layer 21 may be improved. When the concentration of the second dopant in the topmost region Ts is smaller than or equal to $1 \times 10^{19}$ cm$^{-3}$, a production amount of the second carrier may be increased, so that the light-emitting efficiency of the active layer 210 may be improved.

In an embodiment, the concentration of the second dopant in the lowest region Te of the fourth layer 107 may be zero. In a region adjacent to the bottommost region Te of the fourth layer 107, for example, the concentration may be $2 \times 10^{17}$ cm$^{-3}$.

When the fifth semiconductor layer 23 or the fifth semiconductor layer 23 is omitted, the topmost region Ts of the fourth layer 107 may have the same vertical level as that of the last well layer of the active layer 21 adjacent to the second semiconductor layer 25. However, the present disclosure is not limited thereto.

When the fourth semiconductor layer 19 or the fourth semiconductor layer 19 is omitted, the bottommost region Te of the fourth layer 107 may be positioned above a bottom face of the active layer 21 adjacent to the second semiconductor layer 25. However, the present disclosure is not limited thereto.

Following conditions may be satisfied so that the lowest point of the fourth layer 107, that is, the bottommost region Te of the fourth layer 107 is positioned above the bottom face of the active layer 21.

In a first condition, the distance between the top region Ts and the bottom region of the fourth layer 107 may be smaller than the thickness of the active layer 21. That is, the distance between the top region Ts and the bottom region of the fourth layer 107 may be 120 nm or smaller.

In a second condition, the arrangement density of the fourth layer 107 may be in a range of $8 \times 10^{17}$ cm$^{-3}$ to $4 \times 10^{18}$ cm$^{-3}$. When the arrangement density of the fourth layer 107 is $8 \times 10^{17}$ cm$^{-3}$ or smaller, the depth of the fourth layer 107 is too small, such that the deep hole injection effect may not be properly implemented. When the arrangement density of the fourth layer 107 is $4 \times 10^{18}$ cm$^{-3}$ or greater, the fourth layer 107 may vertically reaches the fourth semiconductor layer 19 located below the active layer 21 or the third semiconductor layer 17 below the semiconductor layer 19, such that the second semiconductor layer 25 and the first semiconductor layer 15 in the fourth layer 107 are too close to each other, thereby to generate an electrical short.

In a third condition, the size of the topmost region Ts of the fourth layer 107 may be in a range of about 200 nm to about 400 nm. When the size of the topmost region Ts of the fourth layer 107 is about 200 nm or smaller, a deep hole injection effect may not be properly implemented. When the size of the topmost region Ts of the fourth layer 107 is about 400 nm or greater, a substantial light-emitting area of the active layer 21 may be reduced, so that the light-emitting efficiency may be reduced.

Therefore, when the above three conditions are satisfied, the lowest point of the fourth layer 107, that is, the bottommost region Te of the fourth layer 107 may be located above the bottom face of the at least active layer 21. In addition, in order that the bottommost region Te of the fourth layer 107 is positioned above the bottom face of the at least active layer 21, the second carrier profile as shown in FIG. 7 may be met. That is, the concentration of the second dopant should be reduced in the fourth layer 107 having the same vertical level as that of the active layer 21 and should be zero in the fifth layer 109 in the recess 22 corresponding to the lower region of the active layer 21.

In one example, when the arrangement density of the fourth layer 107 is excessive or the depth of the fourth layer 107 is larger, the concentration of the second dopant in the second semiconductor layer 25 disposed in the fourth layer 107 may be detected in the fourth layer 107 having the same vertical level that of the third semiconductor layer 17 via the active layer 21 and the fourth semiconductor layer 19, as shown in FIG. 8. In this case, the lowest region Te of the fourth layer 107, that is, the lowest point may be located below the top face of the third semiconductor layer 17. The larger depth of the fourth layer 107 may be related to the increase in the size of the topmost region Ts of the fourth layer 107. That is, as the size of the topmost region Ts of the fourth layer 107 increases, the depth of the fourth layer 107 may be larger.

As described above, when the arrangement density of the fourth layer 107 is $4 \times 10^{18}$ cm$^{-3}$ or greater, or when the size of the topmost region Ts of the fourth layer 107 is 400 nm or greater, the lowest point of the fourth layer 107 may be located below the top face of the third semiconductor layer 17.

The lowest point of the fourth layer 107 may be located below the top face of the third semiconductor layer 17. Specifically, the lowest point of the fourth layer 107 may coincide with the lowest point of the recess 18 of the third semiconductor layer 17. The lowest point of the fourth layer 107 may be located between the lowest point of the recess 18 of the third semiconductor layer 17 and the top face of the third semiconductor layer 17.

The embodiment enables the recess 22 to be formed in the active layer 21 due to the recess 18 formed in the third semiconductor layer 17, thereby realizing the deep hole injection effect of the second semiconductor layer 25 disposed in the fourth layer 107, thereby to improve the light output and the operation voltage.

The embodiment may easily identify the shape of the recess 22 formed in the active layer 21 based on the change in the concentration of the second dopant using the ion analysis device.

The embodiment continues the process of identifying the shape of the recess 22 formed in the active layer 21 using the ion analysis device, thereby providing the optimal recess structure, for example, a structure in which the lowest point of the recess of the active layer 21 is located above the bottom face of the active layer 21. This may maximize the effect of the deep hole injection, and the light extraction from the active layer 21, thereby to improve the light efficiency, thereby improving the light output and the operation voltage.

Horizontal Semiconductor Device

Figure 11:
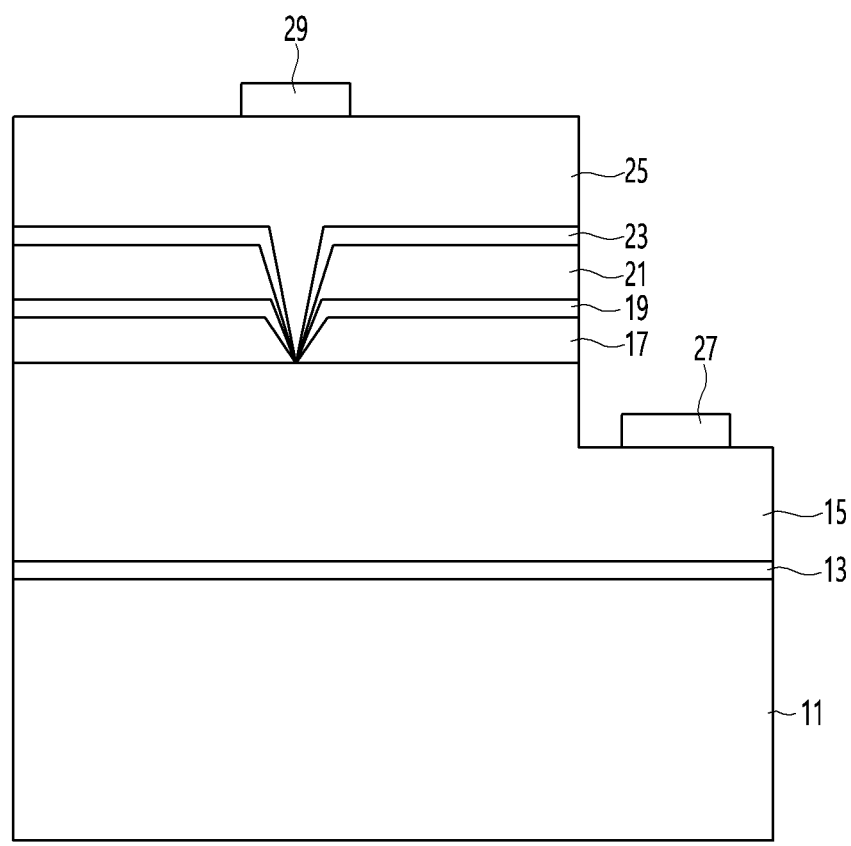
FIG. 11 shows a horizontal semiconductor device.

FIG. 11 shows a horizontal semiconductor device.

The horizontal semiconductor device may be manufactured by adding a subsequent process to a manufacturing process of the semiconductor device according to the first embodiment shown in FIG. 1.

Referring to FIG. 11, when the semiconductor device according to the first embodiment shown in FIG. 1 is provided, mesa etching may be executed such that a partial region of the semiconductor structure may be removed. That is, an edge region of each of the second semiconductor layer 25, the fifth semiconductor layer 23, the active layer 21, the fourth semiconductor layer 19, the third semiconductor layer 17, and the first semiconductor layer 15 may be removed via the mesa etching. An upper portion of the first semiconductor layer 15 may partially be removed, and a lower portion thereof may not be removed.

Subsequently, a first electrode 27 may be disposed on the first semiconductor layer 15 which has been partially etched via the mesa etching. A second electrode 29 may be disposed on the second semiconductor layer 25. Each of the first electrode 27 and the second electrode 29 may be made of a metal material having excellent conductivity. Each of the first electrode 27 and the second electrode 29 may include at least one layer.

A top face of the first electrode 27 may have a lower vertical level than that of the active layer 21 of the semiconductor structure. Thus, when light generated in the active layer 21 of the semiconductor structure is emitted from the lateral face of the active layer 21, the light may not be reflected from the first electrode 27.

Otherwise, the top face of the first electrode 27 may have a higher vertical level than that of the active layer 21 of the semiconductor structure. In this case, when light generated in the active layer 21 of the semiconductor structure is emitted from the lateral face of the active layer 21, the light may be reflected from a lateral face of the first electrode 27.

Although not shown, a transparent electrode layer may be formed on the second semiconductor layer 25. The transparent electrode layer may be formed using a sputtering apparatus. However, the present disclosure is not limited thereto.

When the transparent electrode layer is formed on the second semiconductor layer 25, the second electrode 29 may be disposed on the transparent electrode layer.

The transparent electrode layer may be made of a transparent conductive material. The transparent electrode layer may be made of a material having excellent ohmic characteristics with the second semiconductor layer 25, and having excellent current spreading characteristics. For example, the transparent electrode layer may be made of at least one selected from a group consisting of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x/ITO$, $Ni/IrO_x/Au$, and $Ni/IrO_x/Au/ITO$. However, the present disclosure is not limited thereto.

After the transparent electrode layer is disposed on the second semiconductor layer 25, mesa etching may be performed. Alternatively, after the mesa etching is performed, the transparent electrode layer may be disposed on the second semiconductor layer 25.

The transparent electrode layer may be disposed on the second semiconductor layer 25, and, then, the second electrode 29 may be disposed on the transparent electrode layer Alternatively, the transparent electrode layer may be disposed on the second semiconductor layer 25, and then mesa etching may be performed, and then second electrode 29 may be disposed on the transparent electrode layer.

Although not shown, the horizontal semiconductor device shown in FIG. 11 may be turned upside down, and may be adopted into a semiconductor device package. In this case, the horizontal semiconductor device may be used as a flip-type semiconductor device. In this case, a reflective electrode layer may be additionally disposed on the second semiconductor layer 25. However, the present disclosure is not limited thereto.

Second Embodiment

FIG. 7 shows a second carrier profile when each layer has a recess. FIG. 7 shows SIMS (Secondary Ion Mass Spectroscopy) data for detecting a component of each layer of a semiconductor device. The SIMS refers to a method for irradiating primary ions to the semiconductor structure and detecting secondary ions constituting the semiconductor structure as scattered by the primary ions and emitted. The SIMS may include TOF-SIMS (Time-of-Flight Secondary Ion Mass Spectrometry) and dynamic-SIMS.

The second embodiment relates to a component content and a doping concentration of each layer of a semiconductor device. The SIMS data may be used to detect a secondary ion intensity and/or a doping concentration of each layer of the semiconductor device. SIMS may employ TOF-SIMS (Time-of-Flight Secondary Ion Mass Spectrometry). Thus, the SIMS data may refer to analysis data from the TOF-SIMS.

SIMS data may be obtained by irradiating the primary ions to a target surface, and counting the number of the secondary ions as emitted. In this connection, the primary ions may be selected from $O_2^+$, $Cs^+$, $Bi^+$, etc. Acceleration voltage may be adjusted to a value within 20 keV to 30 keV. Irradiation current may be adjusted to a value in a range of from 0.1 pA to 5.0 pA. An irradiation area may be 20 nm×20 nm. However, conditions for measuring a sample are not limited thereto, and may vary depending on a component of the sample.

That is, the SIMS data may be used to detect the secondary ion intensity and/or the doping concentration included in each layer of the semiconductor device. That is, when primary ions are irradiated to each of the first conductive-type semiconductor layer, the active layer 21, and the second conductive-type semiconductor layer shown in FIG. 1, secondary ions may be emitted from the first conductive-type semiconductor layer, the active layer 21, and the second conductive-type semiconductor layer. Thus, the indium (In) ion intensity, the Si concentration, and the Mg concentration included in each layer may be detected based on the released secondary ions.

The SIMS data may include collection of secondary ion mass spectra while gradually etching the semiconductor structure inwardly from a surface of the light emission structure (depth being zero).

Further, a result from the SIMS analysis may be interpreted as a spectrum related to the secondary ion intensity or the doping concentration of a material. In this connection, noise in a range of 0.9 times to 1.1 times may occur in the analysis of the secondary ion intensity or the doping concentration. Therefore, the term "same as or equal to" may refer to inclusive noise of 0.9 to 1.1 times of one specific secondary ion intensity or doping concentration.

Based on the SIMS data shown in FIG. 7, a layer corresponding to each of points ① to ⑦, and each of sections S1 to S6 may be easily identified based on a relative intensity of secondary ions and/or a concentration of a dopant. In the secondary ion analysis, the secondary ion intensity may be expressed as a log scale. However, the present disclosure is not limited thereto. The secondary ion intensity may be expressed as a linear scale. The secondary ion intensity may mean an intensity of secondary ions that are emitted from the light emission structure after the primary ions are irradiated to the light emission structure. The secondary ions may include at least one of In, Al, Ga, N, As, and P. In this embodiment, the relative intensity of the indium (In) ions is described. However, the present disclosure is not limited thereto. A relative intensity of ions of other materials may be referenced.

In the second embodiment, each of layers may be easily identified using the indium (In) ion intensity, and a concentration of each of the first and second dopants as shown in a graph. For example, first to sixth points ① to ⑦ may be defined using the indium (In) ion intensity, and the concentrations of the first and second dopants. The layers may be identified based on the first to sixth points ① to ⑦ as defined as described above. In a following description, the first dopant may include the silicon (Si) and the second dopant may include magnesium (Mg).

In FIG. 7, a region in which the indium (In) ion intensity is 0.3 to 0.5 times larger than the highest indium (In) ion intensity within the semiconductor structure may have a plurality of inflection points. Specifically, each of the plurality of inflection points may refer to an inflection point between a region where the indium (In) ion intensity decreases in a direction toward the substrate, and a region where the indium (In) ion intensity increases in a direction toward a surface of the semiconductor structure. The inflection point may refer to a point at which the indium (In) ion intensity may be minimum or maximum in the direction to the surface or in the direction toward the substrate of the semiconductor structure. Within the semiconductor structure, a peak point at which the indium (In) ion intensity may be maximum may be present. In a region in which the indium (In) ion intensity is 0.3 to 0.5 times of the maximum indium (In) ion intensity, a point at which the indium (In) ion intensity is minimum may be present.

A point at which the indium (In) ion intensity has the same the indium (In) ion intensity as that of the lowest peak among the plurality of inflection points and which is closest to the surface may be defined as the first point ①. In addition, each of the second point ②, the third point ③, and the fourth point ④ may have the same indium (In) ion intensity as the indium (In) ion intensity as the lowest peak. In this connection, the second point ② may be closest to the substrate, then the third point ③ may be adjacent to the second point ② in the direction toward the surface, and the fourth point ④ may be adjacent to the third point ③ in the direction toward the surface.

A region between the first point ①, and second point ② may be defined as the first section S1. For example, the first section may be the active layer that generates light. A region between the second point ② and third point ③ may be defined as the second section S2. For example, the second section may be a carrier injection layer that facilitates carrier injection. A region between the third point ③ and the fourth point ④ may be defined as the third section S3. For example, the third section may be a superlattice layer, a current spreading layer, or a stress relaxation layer. In this connection, the carrier may be an electron.

In FIG. 7, the fifth point ⑤ at which the concentration of the first dopant is the same as the highest first dopant concentration in a region with the concentration of the first dopant is 0.1 times to 0.2 times of the first dopant concentration at the highest peak. The fifth point ⑤ may be closest to the substrate.

A region between the fourth point ④ and the fifth point ⑤ may be defined as the fourth section S4. For example, the fourth section may be a middle temperature (MT) layer. As described above, the middle temperature may be a temperature for growing the middle temperature layer. The growth rate in the vertical direction, and the horizontal direction of the middle temperature layer may be controlled by adjusting the temperature, adjusting the indium (In) content, and adjusting the thickness of each sub-semiconductor layer in the middle temperature layer, so that a plurality of recesses may be formed therein. For example, the recess may have a V-pit shape. When the middle temperature layer has the recess, each of a superlattice layer, a carrier injection layer, and an active layer may have a recess corresponding to the recess in the MT layer.

In one example, a curve of the concentration of the second dopant may have a plurality of inflection points V11, V12, and V13. The plurality of inflection points V11, V12, and V13 may be arranged between the surface of the semiconductor structure and the first point ①. The second inflection point V12 may be lower than the first inflection point V11, and the third inflection point V13 may be lower than the first, and second inflection points V11, and V12. In this case, the first inflection point V11 at which the concentration of the second dopant is the highest, and which is closest to the first point ① in the direction toward the surface of the semiconductor structure may be defined as the sixth point ⑥. In this case, a region between the first point ① and sixth point ⑥ may be defined as the fifth section S5. For example, the fifth section may be a carrier injection layer. In this connection, the carrier may be an electron. The second inflection point V12 at which the concentration of the second dopant is lower than that of the first inflection point V11, and is higher than that of the third inflection point V13, and which is adjacent to the sixth point ⑥ in the direction toward the surface of the semiconductor structure may be defined as the seventh point ⑦. A region between sixth point ⑥ and seventh point ⑦ may be defined as the sixth section S6. For example, the sixth section may be a carrier injection layer. In this connection, the carrier may be a hole.

The first to seventh points ① to ⑦ may have the designated and different orders.

In one example, a position of the third inflection point 13, and a position of the first point ① may be the same as each other. That is, the third inflection point 13, and the first point ① may be located on the same plane.

Hereinafter, the points ① to ⑦, and the sections S1 to S6 between the points ① to ⑦ and will be described in detail.

A plurality of peaks P11 and P12, and valleys P21 and P22 may be arranged in a region between the first point ① and the second point ②. The first valleys P21 may be alternately arranged with the first peaks P11. The second valleys P22 may be alternately arranged with the second peaks P12. In addition, the plurality of second peaks P12, and the plurality of second valleys P22 may be alternately arranged with each other. The indium (In) ion intensity of the second peak P12 may be lower than the indium (In) ion intensity of the first peak P11. The indium (In) ion intensity of the second valley P22 may be lower than the indium (In) ion intensity of the first valley P21. The third valley P23 may have the indium (In) ion intensity lower than that of each of the first and second valleys P21 and P22. A difference D11 between the indium (In) ion intensity of the first peak P11, and the indium (In) ion intensity of the second peak P12 may be smaller than a difference D21 between the indium (In) ion intensity of the first valley P21, and the indium (In) ion intensity of the second valley P22. The difference D11 between the indium (In) ion intensity of the first peak P11, and the indium (In) ion intensity of the second peak P12 may be the same as a difference D21 between the indium (In) ion intensity of the first valley P21, and the indium (In) ion intensity of the second valley P22.

In the region between the first point ① and the second point ②, the highest peak of the indium (In) ion intensity may be located. The highest peak may be one of the plurality of first peaks P11. The second peak P11 may have the indium (In) ion intensity which may be 0.93 times to 0.95 times of that of the highest peak. The first valley P21 may have the indium (In) ion intensity which may be 0.9 to 0.93 times of that of the highest peak. The second valley P22 may have the indium (In) ion intensity which may be 0.3 to 0.5 times of that of the highest peak. The region between the first point ①, and the second point ② may be the active layer. Further, the active layer may correspond to the active layer of the first embodiment as described above, but is not necessarily limited thereto. Among the plurality of peaks P11 and P12, and valleys P21 and P22 in terms of the indium (In) ion intensity, the highest peak may correspond to the well layer. When a barrier layer having the indium (In) ion intensity which is 0.3 to 0.5 times of the indium (In) ion intensity of the peak P11 is present, the light-emitting efficiency of the semiconductor device may be improved.

A peak of the concentration of the first dopant may be present in the region between the second point ② and the third point ③. The highest concentration of the first dopant in this region may be 0.2 to 0.35 times of that of the highest peak of the first dopant concentration in an entirety of the semiconductor structure. In the region between the second point ②and the third point ③, a valley in terms of the indium ion intensity may be located. A difference D22 between the indium (In) ion intensity of the located valley, and the indium (In) ion intensity of the valley P22 of the first section S1 may be greater than the difference D21 between the indium (In) ion intensity of the valley P21 of the first section S1, and the indium (In) ion intensity of the valley P22. For example, the difference D22 between the indium (In) ion intensity of the located valley, and the indium (In) ion intensity of the valley P22 of the first section S1 may be 1 to 5 times larger than the difference D21 between the indium (In) ion intensity of the valley P21 of the first section S1, and the indium (In) ion intensity of the valley P22. However, the present disclosure is not limited thereto.

In the region between the third point ③, and the fourth point ④, at least one peak in terms of the indium ion intensity may be arranged. The at least one peak in terms of the indium (In) ion intensity may have the indium (In) ion intensity which may be 0.7 to 0.85 times of that of the highest peak.

In the region between the fourth point ④ and the fifth point ⑤, a plurality of peaks, and valleys in terms of the indium (In) ion intensity may be arranged. The peak may have the indium (In) ion intensity which may be 0.5 to 0.7 times of that of the highest peak. The valley may be the lowest point between the plurality of peaks in terms of the indium (In) ion intensity.

The sixth point ⑥ may have the first inflection point V11 in terms of the concentration of the second dopant. The seventh point ⑦ may have the second inflection point V12 in terms of the concentration of the second dopant. The first point ① may have the third inflection point V13 in terms of the second dopant concentration. That is, the third inflection point V13 may be located at the same point as the first point ①. In addition, a fourth inflection point V14 may be present in a specific portion of the region between the first point ① and the second point ②.

The concentration of the second dopant at the first inflection point V11 may be highest. The second inflection point V12 may be lower than the first inflection point V11. The third inflection point V13 may be lower than the second inflection point V12. The fourth inflection point V14 may be lower than the third inflection point V13.

The concentration of the second dopant may decrease in a direction from the first inflection point V11 to the second inflection point V12 in the direction toward the surface of the semiconductor structure. The gradient at which the concentration of the second dopant decreases between the first inflection point V11, and the second inflection point V12 may be defined as a first gradient G11. The concentration of the second dopant may decrease in a direction from the first inflection point V11 to the third inflection point V13 toward the substrate 11. The gradient at which the concentration of the second dopant decreases between the first inflection point V11, and the third inflection point V13 may be defined as a second gradient G12. The concentration of the second dopant may decrease in a direction from the third inflection point V13 to the fourth inflection point V14 toward the substrate 11. The gradient at which the concentration of the second dopant decreases between the third inflection point V13, and the fourth inflection point V14 may be defined as a third gradient G13.

As shown in FIG. 7, the first inflection point V11 has a peak, and the second inflection point V12 may have a valley. The third inflection point V13 may be a point where different gradients, for example, the second gradient G12, and the third gradient G13 meet each other. The fourth inflection point V14 may be the endpoint of the concentration of the second dopant shown in FIG. 7. That is, the concentration of the second dopant is zero in a region between the fourth inflection point V14 and the substrate 11. This may mean that the second dopant is not doped into the region between the substrate 11 and the fourth inflection point V14. The growth rate in the vertical and horizontal directions of the region between the fourth point ④ and the fifth point ⑤, that is, the fourth section S4 may be controlled via the temperature adjustment during the growth thereof, the adjustment of the indium (in) content therein, and a spacing between the peak and the valley in terms of the concentration of the second dopant. Thus, the plurality of recesses may be formed. For example, the recess may have a V-pit shape. Due to the recess of the fourth section S4, each of the third section S3, the second section S2, and the first section S1 may have a recess. In this case, the second dopant may be doped into the fifth section S5, and sixth section S6 and the recesses thereof. Therefore, the size or the depth of the recess may be easily identified based on a length between the third inflection point V13, and the fourth inflection point V14 in terms of the concentration of the second dopant or the gradient between the third inflection point V13, and the fourth inflection point V14 in terms of the concentration of the second dopant.

The second gradient G12 may be larger than the first gradient G11. The third gradient G13 may be smaller than the second gradient G12. The third gradient G13 may be smaller than the first gradient G11. However, the present disclosure is not limited thereto. The first to third gradient G11, G12, and G13 may vary depending on the concentration of the second dopant. In particular, the third gradient G13 may vary depending on the shape of the recess 22 as described above. In addition, the position of the fourth inflection point V14 may also vary depending on the shape of the recess 22. This will be described later.

Therefore, the concentration of the second dopant may be increased from the second inflection point V12 at the first gradient G11 to reach the first inflection point V11 and may be decreased from first inflection point V11 at the second gradient G12 to reach the third inflection point V13, and may be decreased from the third inflection point V13 at the third gradient G13 to reach the fourth inflection point V14. After the concentration reaches the fourth inflection point V14, the concentration of the second dopant is zero. That is, the concentration of the second dopant is zero in a region between the substrate 11 and the fourth inflection point V14.

In one example, the first section S1 may include a first sub-section S11, and a second sub-section S12. For example, the first sub-section S11 may be defined as a region between the third inflection point V13, and the fourth inflection point V14 in terms of the concentration of the second dopant. The second sub-section S12 may be defined as a region between the fourth inflection point V14, and the second point (in terms of the concentration of the second dopant.

In the first sub-section S11, the concentration of the second dopant may decrease in a direction from the third inflection point V13 to the fourth inflection point V14 at the third gradient G13. The first sub-section S11 may include a plurality of first peaks P11 and a plurality of first valleys P21 which are alternately arranged with each other. Further, some second peaks and/or second valleys among the plurality of the second peaks P12 and plurality of second valleys P22 alternately arranged with each other may be positioned in the first sub-section S11. For example, the first sub-section S11 may include at least one second valley P22 or second peak P12 adjacent to the last first peak P11, among the plurality of second peaks P12 and the plurality of second valley P22.

Thus, the fourth layer 107 may be identified based on the first sub-section S11, in that in the first sub-section S11, the concentration of the second dopant may decrease in a direction from the third inflection point V13 to the fourth inflection point V14 at the third gradient G13; and the first sub-section S11 includes the plurality of first peaks P11 and the plurality of first valleys P21 which are alternately arranged with each other, and some second peaks and/or second valleys of the plurality of second peaks P12 and the plurality of second valleys P22.

The third inflection point V13 among the third inflection point V13 and fourth inflection point V14 defining the first sub-section S11 may correspond to the topmost region Ts of the fourth layer 107, and the fourth inflection point V14 may correspond to the bottommost region Te of the fourth layer 107. Therefore, in the fourth layer 107, the concentration of the second dopant is highest in the topmost region Ts of the fourth layer 107, and the concentration of the second dopant is lowest or zero in the bottommost region Te of the fourth layer 107. It may be seen that the concentration of the second dopant decreases in a direction from the topmost region Ts of the fourth layer 107 to the bottommost region Te thereof. From this finding, it may be seen that the size of the recess 22 decreases as the recess 22 extends in a direction from the topmost region Ts to the bottommost region Te. As a result, because the size of the recess 22 decreases in a direction from the top region Ts toward the bottom region Te, an amount of the second dopants detected in the topmost region Ts where the size of the recess 22 is large may be larger, while an amount of the second dopants detected in the bottommost region Te where the size of the recess 22 is small may be smaller. Accordingly, a profile that the concentration of the second dopant decreases from the third inflection point V13 to the fourth inflection point V14 at the third gradient G13 may be obtained. The concentration of the second dopant may be zero in the lowest region Te of the fourth layer 107. However, the recess 22 in the bottommost region Te of the fourth layer 107 may have a predetermined size. As shown in FIG. 1, the recess 22 may pass through the active layer 21, the fourth semiconductor layer 19, and the third semiconductor layer 17, and terminate at or above the bottom of third semiconductor layer 17. That is, the size of the recess 22 at or above the bottom of the third semiconductor layer 17 may be zero.

As described above, the recess 22 may pass through the active layer 21, the fourth semiconductor layer 19, and the third semiconductor layer 17, and terminates at or above the bottom of the third semiconductor layer 17. Thus, the distribution of the second dopant in the recess 22 may vary depending on the size and the depth of the recess 22 in the topmost region Ts. Accordingly, a position of the fourth inflection point V14 from which the concentration of the second dopant is zero may vary. For example, as shown in FIG. 7, the fourth inflection point V14 may be located in the third semiconductor layer 17.

Therefore, the location of the fourth inflection point V14 may be identified using the SIMS data as shown in FIG. 7. Based on the identification result, the size or the depth of the recess 22 may be controlled during the deposition process such that the position of the fourth inflection point V14 is present in a region including some peaks and/or valleys among the plurality of the second peaks P12, and the plurality of second valleys P22 which are alternately arranged with each other, as shown in FIG. 7. In this way, an optimal semiconductor device that may improve light output, and operation voltage may be realized.

In addition, identifying a position of the fourth inflection point V14 based on the SIMS data as shown in FIG. 7 may allow easily evaluating the quality of the semiconductor device based on the identified location of the fourth inflection point V14.

In one example, the concentration of the second dopant is zero in the second sub-section S12. Further, the second sub-section S12 may include remaining second peaks P12 and the second valleys P22 which are not included in the first sub-section S11, among the plurality of second peaks P12, and the plurality of second valleys P22 alternately arranged with each other.

Thus, the fifth layer 109 may be identified based on the second sub-section S12, in that in the second sub-section S12, the concentration of the second dopant is zero, and the second sub-section S12 includes the remaining second peaks P12 and the second valleys P22 which are not included in the first sub-section S11, among the plurality of second peaks P12, and the plurality of second valleys P22 alternately arranged with each other.

In FIG. 7, the region between the fourth inflection point V14 and the second point ② may be defined as the fifth layer 109. However, the recess 22 may pass through not only the active layer 21 but also the fourth semiconductor layer 19, and the third semiconductor layer 17. Thus, the fourth inflection point V14 may be located in any one of the fourth semiconductor layer 19, and the third semiconductor layer 17. However, the present disclosure is not limited thereto. It is clear that the concentration of the second dopant will be zero in the fifth layer 109 identified based on the second sub-section S12 as the region between the fourth inflection point V14 and the second point ② even when the position of the fourth inflection point V14 changes. Therefore, the fifth layer 109 may be an undoped semiconductor layer that does not include the dopant.

In the fifth section S5, the concentration of the second dopant may have the second gradient G12. That is, the concentration of the second dopant may decrease from the first inflection point V11 to the third inflection point V13 toward the substrate 11 at the second gradient G12.

As such, the first layer 101 may be identified based on the fifth section S5 having the second gradient G12 at which the second dopant concentration decreases from the first inflection point V11 to the third inflection point V13. The first layer 101 may correspond to the fifth section S5. However, the present disclosure is not limited thereto.

In the sixth section S6, the concentration of the second dopant may have the first gradient G11. That is, the concentration of the second dopant may decrease from the first inflection point V11 to the second inflection point V12 along the direction toward the surface of the semiconductor structure at the first gradient G11.

As such, the second layer 103 may be identified based on the sixth section S6 in which the concentration of the second dopant decreases from the first inflection point V11 to the second inflection point V12 at the first gradient G11. The second layer 103 may correspond to the sixth section S6. However, the present disclosure is not limited thereto.

As described above, the first to seventh points ① to ⑦, and the first to fourth inflection points V11, V12, V13, and V14 may be defined based on the data on the concentration of the second dopant and/or the indium (In) ion intensity as shown in FIG. 7. Thus, the first to sixth section S1 to S6 may be easily identified based on the first to seventh points ① to ⑦. Thus the first to fifth layers 101, 103, 105, 107, and 109 may be easily identified based on the first to fourth inflection points V11, V12, V13, and V14. In particular, the shape of the recess 22 may be estimated based on the profile of the second dopant in the fourth layer 107 disposed in the recess 22. Controlling the shape of the recess 22 such that a last point from which the concentration of the second dopant is zero, that is, the fourth point ④ is located in the active layer 21 may allow implementing an optimal semiconductor device capable of improving the light output, and the operation voltage.

In addition, identifying a position of the fourth inflection point V14 using the SIMS data as shown in FIG. 7 may allow the quality of the corresponding semiconductor device to be easily evaluated.

As described above, according to the analysis method of each layer using the graph according to the second embodiment, the plurality of points may be defined based on the indium (In) ion intensity, and the first dopant concentration, and the second dopant concentration. Then, the defined points may be used to easily grasp the shape, the size, and/or the depth of the recess as well as each of the plurality of layers.

Semiconductor Device Package

Figure 12:
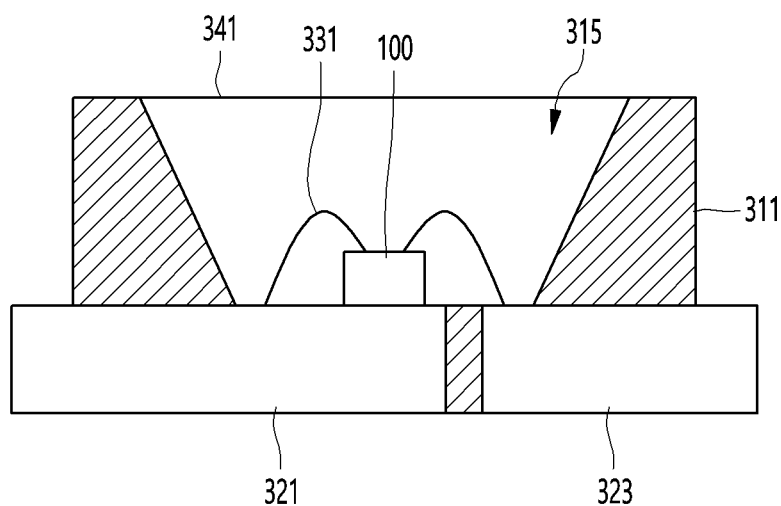
FIG. 12 shows a semiconductor device package according to an embodiment.

FIG. 12 shows a semiconductor device package according to an embodiment.

As shown in FIG. 12, a semiconductor device package according to an embodiment may include a body 311 having a cavity 315, a first lead frame 321 and a second lead frame 323 disposed within the body 311, the semiconductor device 100, wires 331, and a molding member 341.

The body 311 may include a conductive material or an insulating material. The body 311 may be made of at least one of resin material, silicon material, metal material, PSG (photo sensitive glass), sapphire ($Al_2O_3$), and a printed circuit board PCB. The resin material may be PPA (polyphthalamide) or epoxy.

The body 311 has the cavity 315 having an open top. The cavity 315 may include a cup structure or a recess structure that is concave from a top face of the body 311. However, the present disclosure is not limited thereto.

The first lead frame 321 is placed in a first region of a bottom region of the cavity 315. The second lead frame 323 is disposed in a second region of the bottom region of the cavity 315. The first lead frame 321 and the second lead frame 323 may be spaced apart from each other within the cavity 315.

Each of the first and second lead frames 321 and 323 may be made of at least one selected from metal materials, for example, titanium (Ti), copper (Cu), nickel (Ni), gold (Au), chromium (Cr), tantalum (Ta), platinum (Pt), tin (Sn), silver (Ag), and phosphorus (P). Each of the first and second lead frames 321 and 323 may be formed of a single metal layer or a metal multi-layer stack.

The semiconductor device 100 may be disposed on at least one of the first and second lead frames 321 and 223. The semiconductor device 100 may be disposed, for example, on the first lead frame 321 and the wire 331 may be connected to the first and second lead frames 321 and 223.

The semiconductor device 100 may emit light beams in at least two wavelength regions. The semiconductor device 100 may include a group III-V compound semiconductor or a group II-VI compound semiconductor. The semiconductor device 100 may employ the technical features of FIG. 1 to FIG. 9.

The molding member 341 may be disposed in the cavity 315 of the body 311. The molding member 341 may include a translucent resin layer such as silicon or epoxy. The molding member 341 may be formed in a single layer or multiple layers.

The molding member 341 may include a phosphor for changing a wavelength of light emitted from the semiconductor device 100 or may not include the phosphor.

For example, when the semiconductor device in which blue light and green light are generated is adopted in the semiconductor device package according to the embodiment, the molding member 341 may include, for example, a red phosphor. Therefore, white light may be rendered via a mixture of the blue light and green light generated from the semiconductor device, and the red light wavelength-converted by the red phosphor included in the molding member.

For example, when the semiconductor device according to each of the third to fifth embodiments, in which all of blue light, green light, and red light are generated, is adopted in the semiconductor device package according to embodiment, the molding member 341 may not include the red phosphor. Even in this case, the molding member may include a phosphor that generates color light other than the red light, when necessary. However, the present disclosure is not limited thereto.

A surface of the molding member 341 may be formed into a flat shape, a concave shape, a convex shape, etc. However, the present disclosure is not limited thereto.

A lens (not shown) may be further formed on a top face of the body 311. The lens may include a concave or/and convex lens structure and may control the light distribution of the light emitted from the semiconductor device 100.

A protective element (not shown) may be disposed in the semiconductor device package. The protection element may be implemented as a thyristor, a Zener diode, or TVS (transient voltage suppression) element.

In one example, the semiconductor device package according to the embodiment may be applied to a light-source device.

Further, the light-source device may include a display, an illumination device, a head lamp, etc. according to an industrial field.

An example of a light-source device may include a display. The display may include a bottom cover, a reflective sheet disposed on the bottom cover, a light-emitting module including a light-emitting element, a light-guide sheet disposed in front of the reflective sheet, and guiding the light emitted from the light-emitting module in a front direction, an optical sheet including prism sheets disposed in front of the light-guide sheet, a display panel disposed in front of the optical sheet, an image signal output circuit connected to the display panel for supplying an image signal to the display panel, and a color filter disposed in front of the display panel. In this connection, the bottom cover, the reflective sheet, the light-emitting module, the light-guide sheet, and the optical sheet may form a backlight unit. Further, the display does not include the color filter. Rather, the display may have a structure in which light-emitting devices for emitting red, green, and blue light beams are disposed, respectively.

Another example of the light-source device may include the head lamp. The head lamp may include a light-emitting module including a semiconductor device package disposed on a substrate, a reflector for reflecting light irradiated from the light-emitting module in a predetermined direction, for example, in a front direction, a lens that refracts light reflected from the reflector in a front direction, and a shade for blocking or reflecting a portion of the light reflected from the reflector toward the lens to form a light-distribution pattern desired by a designer desires.

Another example of the light-source device may include the illumination device. The illumination device may include a cover, a light-source module, a radiator, a power supply, an inner casing, and a socket. Further, the light-source device according to an embodiment may further include at least one of a member and a holder. The light-source module may include the semiconductor device package according to the embodiment.

Features, structures, effects, etc. as described above in the embodiments are included in at least one embodiment, and is not necessarily limited to one embodiment. Furthermore, the features, structures, effects, etc. exemplified in the embodiments may be combined with each other or modified in other embodiments by a person having ordinary knowledge in the field to which the embodiments belong. Therefore, contents related to such combinations, and modifications should be interpreted as being included in the range of the disclosure.

The embodiment has been mainly described, but this is merely an example, and does not limit the present disclosure. Those of ordinary skill in the field to which the embodiment belongs will find that various modifications, and applications as not exemplified above are possible within a range that does not depart from the essential characteristics of the present disclosure. For example, each component specifically shown in the embodiment may be modified. In addition, variations related to the modifications and applications should be interpreted as being included in the range of the disclosure set in the attached claims.

The embodiments may be applied to a semiconductor device, and to a field related thereto.

What is claimed is:

1. A semiconductor device comprising:
a first conductive-type semiconductor layer;
a second conductive-type semiconductor layer on the first conductive-type semiconductor layer; and
an active layer disposed between the first conductive-type semiconductor layer and the second conductive-type semiconductor layer;
wherein when primary ions are irradiated to the first conductive-type semiconductor layer, the active layer, and the second conductive-type semiconductor layer, secondary ions are emitted from the first conductive-type semiconductor layer, the active layer, and the second conductive-type semiconductor layer, wherein an indium (In) ion intensity, a silicon (Si) concentration, and a magnesium (Mg) concentration of the first conductive-type semiconductor layer, the active layer, and the second conductive-type semiconductor layer are detected based on the emitted secondary ions,
wherein the semiconductor device has a plurality of inflection points of the indium (In) ion intensity, wherein the indium (In) ion intensities at the plurality of inflection points are 0.3 to 0.5 times of a highest indium (In) ion intensity in a vertical entire region of the semiconductor device,
wherein the semiconductor device has:
a first point having the same indium (In) ion intensity as a lowest indium (In) ion intensity among the indium (In) ion intensities at the plurality of inflection points;
a second point having the same indium (In) ion intensity as the first point, wherein the second point is adjacent to the first point, and the first point is closer to a first vertical end of the semiconductor device than the second point;
a first inflection point of the Mg concentration located at the same point as the first point;
a second inflection point of the Mg concentration adjacent to the first inflection point in a direction toward the first vertical end of the semiconductor device, wherein the second inflection point has the Mg concentration higher than the Mg concentration of the first inflection point; and
a third inflection point of the Mg concentration adjacent to the second inflection point in the direction toward the first vertical end of the semiconductor device, wherein the third inflection point has the Mg concentration higher than the Mg concentration of the first inflection point, and lower than the Mg concentration of the second inflection point,
wherein the active layer corresponds to a region between the first point and the second point,
wherein the second conductive-type semiconductor layer includes a first second-conductive-type semiconductor layer and a second second-conductive-type semiconductor layer,
wherein the first second-conductive-type semiconductor layer corresponds to a region between the first point and the second inflection point, and the second second-conductive-type semiconductor layer corresponds to a region between the second inflection point and the third inflection point,
wherein the Mg concentration in the first second-conductive-type semiconductor layer increases in a direction toward the first vertical end of the semiconductor device,
wherein the Mg concentration in the second second-conductive-type semiconductor layer decreases in a direction toward the first vertical end of the semiconductor device,
wherein in a region between the first point and the second point, the indium (In) ion intensity includes a plurality of first peaks and valleys alternately arranged with each other and a plurality of second peaks and valleys alternately arranged with each other,
wherein the indium (In) ion intensity of the plurality of second peaks and valleys is lower than the indium (In) ion intensity of the plurality of first peaks and valleys, and
wherein a difference between the indium (In) ion intensity of a highest first peak and the indium (In) ion intensity of a highest second peak is smaller than a difference between the indium (In) ion intensity of a lowest first valley and the indium (In) ion intensity of a lowest second valley.

2. The semiconductor device of claim 1, wherein the semiconductor device further has:
a fourth inflection point adjacent to the first inflection point in a direction toward a second vertical end of the semiconductor device, wherein the fourth inflection point has the Mg concentration lower than the Mg concentration of the first inflection point, and wherein the first and second vertical ends are opposite to each other,
wherein the active layer includes a first layer and a second layer,
wherein the first layer corresponds to a region between the first inflection point and the fourth inflection point,
wherein the second layer corresponds to a region between the fourth inflection point and the second point.

3. The semiconductor device of claim 2, wherein the Mg concentration in the first layer decreases in the direction toward the second vertical end of the semiconductor device.

4. The semiconductor device of claim 2, wherein the Mg is absent in the second layer.

5. The semiconductor device of claim 2, wherein a first gradient of the Mg concentration in the first second-conductive-type semiconductor layer is greater than a second gradient of the Mg concentration in the second second-conductive-type semiconductor layer.

6. The semiconductor device of claim 5, wherein a third gradient of the Mg concentration in the first layer is smaller than the first gradient of the Mg concentration in the first second-conductive-type semiconductor layer.

7. The semiconductor device of claim 6, wherein at the first inflection point, the first gradient of the Mg concentration meets the third gradient of the Mg concentration, and
wherein at the second inflection point, the second gradient of the Mg concentration meets the first gradient of the Mg concentration.

8. The semiconductor device of claim 1, further comprising:
a third point present in a partial region where the Si concentration is lower than a highest Si concentration in the vertical entire region of the semiconductor device, wherein the third point has a highest Si concentration in the partial region and the same indium (In) ion intensity as the first and second points,
wherein the third point is adjacent to the second point, and the second point is closer to the first vertical end of the semiconductor device than the third point, and
wherein the first conductive-type semiconductor layer corresponds to a region between the second point and the third point.

9. The semiconductor device of claim 8, further comprising:
a fourth point having the same indium (In) ion intensity as the first, second and third points, wherein the fourth point is adjacent to the third point, and the fourth point is closer to a second vertical end of the semiconductor device than the third point, wherein the first and second vertical ends are opposite to each other; and
a fifth point having an indium (In) ion intensity lower than that of the first, second, third, and fourth points, wherein the fifth point is adjacent to the fourth point, and the fifth point is closer to the second vertical end of the semiconductor device than the fourth point.

10. The semiconductor device of claim 9, wherein the first conductive-type semiconductor layer includes a first first-conductive-type semiconductor layer, a second first-conductive-type semiconductor layer, and a third first-conductive-type semiconductor layer,
wherein the first first-conductive-type semiconductor layer corresponds to a region between the second point and the fourth point, and has a peak of the Si concentration, and a valley of the indium (In) ion intensity,
wherein the second first-conductive-type semiconductor layer corresponds to a region between the fourth point and the fifth point, and
wherein the third first-conductive-type semiconductor layer corresponds to a region between the fifth point and the second vertical end.

* * * * *